US011443968B2

(12) United States Patent
Kuwahara

(10) Patent No.: US 11,443,968 B2
(45) Date of Patent: Sep. 13, 2022

(54) SUBSTRATE TREATING APPARATUS AND SUBSTRATE TRANSPORTING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 401 days.

(21) Appl. No.: 16/724,429

(22) Filed: Dec. 23, 2019

(65) Prior Publication Data

US 2020/0211880 A1    Jul. 2, 2020

(30) Foreign Application Priority Data

Dec. 28, 2018   (JP) .............................. JP2018-248736

(51) Int. Cl.
| | | |
|---|---|---|
| *G11C 16/04* | (2006.01) | |
| *H01L 21/677* | (2006.01) | |
| *G03F 7/20* | (2006.01) | |
| *H01L 21/67* | (2006.01) | |

(52) U.S. Cl.
CPC ......... *H01L 21/67742* (2013.01); *G03F 7/20* (2013.01); *H01L 21/67178* (2013.01); *H01L 21/67225* (2013.01); *H01L 21/67766* (2013.01)

(58) Field of Classification Search
CPC ......... H01L 21/67742; H01L 21/67178; H01L 21/67225; H01L 21/67766; G03F 7/20
See application file for complete search history.

(56) References Cited

U.S. PATENT DOCUMENTS

| | | | | |
|---|---|---|---|---|
| 6,832,863 | B2* | 12/2004 | Sugimoto | ......... H01L 21/67276 414/940 |
| 10,908,503 | B2* | 2/2021 | Choi | ..................... G03F 7/3057 |
| 11,152,233 | B2* | 10/2021 | Inagaki | ............. H01L 21/67745 |
| 2004/0005149 | A1 | 1/2004 | Sugimoto et al. | ............ 396/564 |

(Continued)

FOREIGN PATENT DOCUMENTS

| | | |
|---|---|---|
| JP | 2003-100587 A | 4/2003 |
| JP | 2010-219434 A | 9/2010 |

(Continued)

OTHER PUBLICATIONS

Notice of Allowance dated Jun. 2, 2021 for corresponding Korean Patent Application No. 10-2019-0168696.

(Continued)

*Primary Examiner* — Pho M Luu
(74) *Attorney, Agent, or Firm* — Ostrolenk Faber LLP

(57) ABSTRACT

A substrate treating apparatus and a substrate transporting method. A platform is placed on a first ID block, and a platform is placed on a second ID block. A currently-used carrier platform is provided only on the first ID block. A substrate is transported in both a forward path and a return path between the first ID block and an IF block. The substrate is sent in the return path from the IF block to the second ID block disposed between a coating block and a developing block without being transported from the IF block to the first ID block. Consequently, transportation process in the return path by the coating block disposed between the first ID block and the second ID block is reduced. As a result, an entire throughput of a substrate treating apparatus can be enhanced.

11 Claims, 14 Drawing Sheets

(56) References Cited

U.S. PATENT DOCUMENTS

| | | | |
|---|---|---|---|
| 2007/0056514 A1 | 3/2007 | Akimoto et al. | 118/716 |
| 2009/0139450 A1 | 6/2009 | Ogura et al. | 118/600 |
| 2010/0236587 A1 | 9/2010 | Hamada et al. | 134/133 |
| 2011/0222994 A1 | 9/2011 | Inagaki et al. | 414/222.07 |
| 2016/0351430 A1 | 12/2016 | Kim et al. | |
| 2020/0211868 A1 | 7/2020 | Kuwahara | |
| 2020/0211881 A1 | 7/2020 | Kuwahara | |
| 2020/0211882 A1 | 7/2020 | Kuwahara et al. | |

FOREIGN PATENT DOCUMENTS

| | | |
|---|---|---|
| JP | 2011-187796 A | 9/2011 |
| JP | 2017-102254 A | 6/2017 |
| JP | 2020-109784 A | 7/2020 |
| JP | 2020-109787 A | 7/2020 |
| JP | 2020-109788 A | 7/2020 |
| KR | 10-2002-0063664 A | 8/2002 |
| KR | 10-2006-0088495 A | 8/2006 |
| KR | 10-2010-0023259 A | 3/2010 |

OTHER PUBLICATIONS

Office Action and Search Report dated Oct. 16, 2020 for corresponding Taiwan Patent Application No. 108147765.
Office Action dated May 10, 2022 for corresponding Japaneses Patent Application No. 2018-248736.

\* cited by examiner

SUBSTRATE TREATING APPARATUS AND SUBSTRATE TRANSPORTING METHOD

CROSS-REFERENCE TO RELATED APPLICATIONS

This application claims priority to Japanese Patent Application No. 2018-248736 filed Dec. 28, 2018, the subject matter of which is incorporated herein by reference in entirety.

BACKGROUND OF THE INVENTION

Field of the Invention

The present invention relates to a substrate treating apparatus for performing treatment on substrates and a substrate transporting method for the substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block (hereinafter, referred to an "ID block", where appropriate), a coating block, a developing block, an interface block (hereinafter, referred to an "IF block", where appropriate) in this order. See, for example, Japanese Unexamined Patent Application Publication No. 2010-219434A.

A carrier platform is provided in the ID block. The ID block takes a substrate from a carrier placed on the carrier platform, and transports the taken substrate to the coating block. The coating block performs a coating process such as resist. The developing bloc performs a developing process on the substrate to which an exposure process has been performed. The IF block loads and unloads the substrate into and from an exposure device.

Moreover, the substrate treating apparatus includes a stocker device (carrier buffer device). See, for example, Japanese Unexamined Patent Application Publication No. 2011-187796A. The stocker device includes keeping shelves for keeping carriers, and a carrier transport mechanism.

SUMMARY OF THE INVENTION

However, the substrate treating apparatus described above possesses the following problems. The substrate treating apparatus transports the substrate to the ID block, the coating block, the developing block, and the IF block in this order (forward path). At this time, the coating block performs the coating process to the substrate while the developing block does not perform the developing process to the substrate. The substrate treating apparatus transports the exposed substrate to the IF block, the developing block, the coating block, and the ID block in this order (return path). At this time, the coating block does not perform the coating process to the substrate while the developing block performs the developing process to the substrate. Such transportation of the substrate reciprocated between the ID block and the IF block accompanies process of only passing the substrate through the block without any process. This may cause a reduced throughput in both the forward path and the return path.

The present invention has been made regarding the state of the art noted above, and its object is to provide a substrate treating apparatus and a substrate transporting method that achieve an enhanced throughput.

Solution to Problem

To achieve the object, the present invention provides a configuration as follows. One aspect of the present invention provides a substrate treating apparatus for performing treatment on a substrate. The substrate treating apparatus includes: a plurality of treating blocks arranged in line; a first indexer block connected to a treating block of the treating blocks on a first end and on which a first carrier platform for placing a carrier capable of accommodating substrates thereon is disposed; and an interface block connected to a treating block of the treating blocks on a second end and configured to load and unload a substrate into and from an external device configured to perform a predetermined treatment; and a second indexer block disposed between two treating blocks of the treating blocks and on which a second carrier platform for placing a carrier thereon is disposed; wherein the first indexer block takes a substrate from the carrier placed on the first carrier platform and sends the taken substrate to the treating block on the first end, the treating blocks and the second indexer block send the substrate, having been sent from the first indexer block, from the treating block on the first end to the interface block via the second indexer block, a treating block disposed between the first indexer block and the second indexer block performs a predetermined treatment on the substrate to be sent when the substrate is sent from the treating block on the first end to the interface block, the interface block unloads the sent substrate into an external device, loads the substrate, subjected to the predetermined treatment by the external device, from the external device, and sends the loaded substrate to the treating block on the second end, a treating block of the treating blocks disposed between the second indexer block and the interface block sends the substrate, having been sent from the interface block, from the treating block on the second end to the second indexer block, when the substrate is sent from the treating block on the second end to the second indexer block, the treating block disposed between the second indexer block and the interface block performs a predetermined treatment on the substrate to be sent, and the second indexer block returns the sent substrate to the carrier placed on the second carrier platform.

With the substrate treating apparatus according to the present invention, the first carrier platform is disposed in the first indexer block, and the second carrier platform is disposed in the second indexer block. A currently-used carrier platform is provided only in the first indexer block. Accordingly, the substrate is transported between the first indexer block and the interface block in both the forward path and the return path. According to this aspect of the present invention, the substrate is sent from the interface block to the second indexer block disposed between the two treating blocks in the return path without being transported to the first indexer block. Consequently, transportation process by the treating block disposed between the first indexer block and the second indexer block is reduced in the return path. As a result, an entire throughput of the substrate treating apparatus can be enhanced.

Moreover, the following is preferred in the substrate treating apparatus described above. That is, the treating blocks include a first treating block configured to perform a first treatment, and a second treating block configured to perform a second treatment. The first indexer block is connected to the first treating block, and the first treating block is connected to the second indexer block. The second indexer block is connected to the second treating block, and the second treating block is connected to the interface block, the interface block loads and unloads the substrate into and from an external device configured to perform a third treatment, the first indexer block takes the substrate from the carrier placed on the first carrier platform and sends the taken substrate to the first treating block, The first treating block performs the first treatment on the substrate, having been sent from the first indexer block, and sends the substrate subjected to the first treatment to the second indexer block. The second indexer block sends the substrate, having been sent from the first treating block, to the second treating block. The second treating block sends the substrate, having been sent from the second indexer block, to the interface block, the interface block unloads the substrate, having been sent from the second treating block, into the external device. The interface block loads the substrate, subjected to the third treatment, from the external device and sends the loaded substrate to the second treating block. The second treating block performs the second treatment on the substrate subjected to the third treatment, and sends the substrate subjected to the second treatment to the second indexer block. The second indexer block returns the substrate subjected to the second treatment to the carrier placed on the second carrier platform.

With the substrate treating apparatus according to the present invention, the first carrier platform is disposed in the first indexer block, and the second carrier platform is disposed in the second indexer block. A currently-used carrier platform is provided only in the first indexer block. Accordingly, the substrate is transported between the first indexer block and the interface block in both the forward path and the return path. According to this aspect of the present invention, the substrate is sent from the interface block to the second indexer block disposed between the first treating block and the second treating block in the return path without being transported to the first indexer block. Consequently, transportation process by the first treating block disposed between the first indexer block and the second indexer block is reduced in the return path. As a result, an entire throughput of the substrate treating apparatus can be enhanced.

Another aspect of the present invention provides a substrate treating apparatus for performing treatment on a substrate. The substrate treating apparatus includes: a plurality of treating blocks arranged in line; a first indexer block connected to a treating block of the treating blocks on a first end and on which a first carrier platform for placing a carrier capable of accommodating substrates thereon is disposed; and an interface block connected to a treating block of the treating blocks on a second end and configured to load and unload a substrate into and from an external device configured to perform a predetermined treatment; and a second indexer block disposed between two treating blocks of the treating blocks and on which a second carrier platform for placing a carrier thereon is disposed; wherein the second indexer block takes a substrate from the carrier placed on the second carrier platform and sends the taken substrate to an adjacent treating block adjacent to the second indexer block toward the interface block, a treating block of the treating blocks disposed between the second indexer block and the interface block sends the substrate, having been sent from the second indexer block, from the adjacent treating block to the interface block, when the substrate is sent from the adjacent treating block to the interface block, the treating block disposed between the second indexer block and the interface block performs a predetermined treatment on the substrate to be sent, and the interface block unloads the sent substrate into the external device, the interface block loads the substrate, subjected to the predetermined treatment by the external device, from the external device and sends the loaded substrate to the treating block on the second end, the treating blocks and the second indexer block send the substrate, having been sent from the interface block, from the treating block on the second end to the first indexer block via the second indexer block, when the substrate is sent from the treating block on the second end to the first indexer block, a treating block disposed between the first indexer block and the second indexer block performs a predetermined treatment on the substrate to be sent, and the first indexer block returns the sent substrate to a carrier placed on the first carrier platform.

With the substrate treating apparatus according to the present invention, the first carrier platform is disposed in the first indexer block, and the second carrier platform is disposed in the second indexer block. A currently-used carrier platform is provided only in the first indexer block. Accordingly, the substrate is transported between the first indexer block and the interface block in both the forward path and the return path. According to this aspect of the present invention, the substrate is sent from the second indexer block, disposed between the two treating blocks, to the interface block without being transported from the first indexer block in the forward path. Consequently, transportation process by the treating block disposed between the first indexer block and the second indexer block is reduced in the forward path. As a result, an entire throughput of the substrate treating apparatus can be enhanced.

Moreover, the following is preferred in the substrate treating apparatus described above. That is, the treating blocks include a first treating block configured to perform a first treatment, and a second treating block configured to perform a second treatment. The first indexer block is connected to the first treating block, and the first treating block is connected to the second indexer block. The second indexer block is connected to the second treating block, and the second treating block is connected to the interface block, the interface block loads and unloads the substrate into and from an external device configured to perform a third treatment, the second indexer block takes a substrate from the carrier placed on the second carrier platform and sends the taken substrate to the second treating block. The second treating block performs the second treatment on the substrate sent from the second indexer block, and sends the substrate subjected to the second treatment to the interface block. The interface block unloads the substrate subjected to the second treatment into the external device. The interface block loads the substrate, subjected to the third treatment, from the external device and sends the substrate, subjected to the third treatment, to the second treating block. The second treating block sends the substrate subjected to the third treatment to the second indexer block. The second indexer block sends the substrate subjected to the third treatment to the first treating block. The first treating block performs the first treatment on the substrate, having been sent from the second indexer block and subjected to the third treatment, and sends the substrate subjected to the first treatment to the first indexer block. The first indexer block returns the substrate subjected to the first treatment to the carrier placed on the first carrier platform.

With the substrate treating apparatus according to the present invention, the first carrier platform is disposed in the first indexer block, and the second carrier platform is disposed in the second indexer block. A currently-used carrier platform is provided only in the first indexer block. Accordingly, the substrate is transported between the first indexer block and the interface block in both the forward path and the return path. According to this aspect of the present invention, the substrate is sent from the second indexer block disposed between the first treating block and the second treating block without being transported from the first indexer block to the interface block in the forward path. Consequently, transportation process by the first treating block disposed between the first indexer block and the second indexer block is reduced in the forward path. As a result, an entire throughput of the substrate treating apparatus can be enhanced.

Moreover, the following is preferred in the substrate treating apparatus described above. That is, the first treating block includes a plurality of first treatment layers arranged in an upward/downward direction, the second treating block includes a single second treatment layer or a plurality of second treatment layers arranged in the upward/downward direction, and the first treatment layers are larger in number than the second treatment layer or the second treatment layers.

When substrate transportation process by the first treatment layers is larger in number than that by the second treatment layer or the second treatment layers, the same number of the first treatment layers and the second treatment layers may elongate a standby time of the second treatment layer or the second treatment layers. Accordingly, it is possible to increase the substrate treating ability of the first treatment layer (first treating block) entirely by increasing the number of the first treatment layers to be larger than that of the second treatment layer or the second treatment layers. In addition, the second indexer block is disposed between the first treating block and the second treating block. Accordingly, it is possible to send the substrate to the treatment layers individually even if the number of the first treatment layers differs from that of the second treatment layer or the second treatment layers.

In the substrate treating apparatus described above, it is preferred that the first treating block is a coating block configured to perform coating treatment, the second treating block is a developing block configured to perform a developing treatment, and the external device is an exposure device configured to perform an exposure treatment.

With such a configuration, it is possible to make the number of coating-treatment layers in the coating block larger than that of developing-treatment layers in the developing block. In the actual substrate treating apparatus, the number of the substrate transporting process is larger by the coating-treatment layer than by the developing-treatment layer. As a result, the substrate treating ability in the entire coating-treatment layer (coating block) can be enhanced.

Moreover, the following is preferred in the substrate treating apparatus described above. That is, the first treating block includes a single first treatment layer or a plurality of first treatment layers arranged in an upward/downward direction, the second treating block includes a plurality of second treatment layers arranged in the upward/downward direction, and the second treatment layers are larger in number than the first treatment layer or the first treatment layers.

When a substrate transportation process by the second treatment layers is larger in number than that by the first treatment layer or the first treatment layers, the same number of the first treatment layers and the second treatment layers may elongate a standby time of the first treatment layer or the first treatment layers. Accordingly, it is possible to increase the substrate treating ability of the second treatment layers (second treating block) entirely by increasing the number of the second treatment layers to be larger than that of the first treatment layer or the first treatment layers. In addition, the second indexer block is disposed between the first treating block and the second treating block. Accordingly, it is possible to send the substrate to the treatment layers individually even if the number of the first treatment layers differs from that of the second treatment layer or the second treatment layers.

It is preferred that the substrate treating apparatus described above further includes a carrier transport mechanism configured to transport the carrier between the first carrier platform and the second carrier platform. For instance, when all the substrates are taken from the carrier placed on the first carrier platform, the carrier transport mechanism is capable of transporting the carrier placed on the first carrier platform to the second carrier platform in order to return the substrates to the carrier on the first carrier platform.

It is preferred in the substrate treating apparatus described above that the carrier transport mechanism is mounted on the first treating block. A currently-used carrier transport mechanism is disposed horizontally with respect to the indexer block. With the configuration of the present invention, the carrier transport mechanism is disposed on the first treating block. Accordingly, an installation area of the currently-used carrier transport mechanism disposed horizontally with respect to the indexer block can be decreased. In other words, reduction in footprint of the substrate treating apparatus is obtainable.

Another aspect of the present invention provides a substrate transporting method for a substrate treating apparatus. The substrate treating apparatus includes: a plurality of treating blocks arranged in line; a first indexer block connected to a treating block of the treating blocks on the first end and on which a first carrier platform for placing a carrier capable of accommodating the substrates thereon is disposed; and an interface block connected to a treating block of the treating blocks on the second end and configured to load and unload a substrate into and from an external device configured to perform a predetermined treatment. The method includes: a taking and sending step of causing the first indexer block to take a substrate from the carrier placed on the first carrier platform and to send the taken substrate to the treating block on the first end; a first sending step of causing the treating blocks and a second indexer block disposed between two of the treating blocks to send the substrate, sent from the first indexer block, from the treating block on the first end to the interface block via the second indexer block; a first treating step of causing a treating block disposed between the first indexer block and the second indexer block to perform a predetermined treatment on the substrate to be sent when the substrate is sent from the treating block on the first end to the interface block; an unloading step of causing the interface block to unload the sent substrate into the external device; a loading and sending step of causing the interface block to load the substrate, subjected to the predetermined treatment by the external device, from the external device and to send the loaded substrate to the treating block on the second end; a second sending step of causing a treating block of the treating blocks disposed between the second indexer block and the interface block to send the substrate, having been sent from the interface block, from the treating block on the second end to the second indexer block; a second treating step of causing the treating block disposed between the second indexer block and the interface block to perform a predetermined treatment on the substrate to be sent when the substrate is sent from the treating block on the second end to the second indexer block; and a returning step of causing the second indexer block to return the sent substrate to the carrier placed on the second carrier platform provided in the second indexer block.

With the substrate transporting method according to the present invention, the first carrier platform is disposed in the first indexer block, and the second carrier platform is disposed in the second indexer block. A currently-used carrier platform is provided only in the first indexer block. Accordingly, the substrate is transported between the first indexer block and the interface block in both the forward path and the return path. According to this aspect of the present invention, the substrate is sent from the interface block to the second indexer block disposed between the two treating blocks in the return path without being transported to the first indexer block. Consequently, transportation process by the treating block disposed between the first indexer block and the second indexer block is reduced in the return path. As a result, an entire throughput of the substrate treating apparatus can be enhanced.

Another aspect of the present invention provides a substrate transporting method for a substrate treating apparatus. The substrate treating apparatus includes: a plurality of treating blocks arranged in line; a first indexer block connected to a treating block of the treating blocks on the first end and on which a first carrier platform for placing a carrier capable of accommodating the substrates thereon is disposed; and an interface block connected to a treating block of the treating blocks on the second end and configured to load and unload a substrate into and from an external device configured to perform a predetermined treatment. The method includes: a taking and sending step of causing the second indexer block, disposed between two treating blocks of the treating blocks, to take a substrate from the carrier placed on the second carrier platform in the second indexer block and to send the taken substrate to an adjacent treating block adjacent to the second indexer block toward to the interface block, a first sending step of causing a treating block of the treating blocks, disposed between the second indexer block and the interface block, to send the substrate, having been sent from the second indexer block, from the adjacent treating block to the interface block; a first treating step of causing the treating block disposed between the second indexer block and the interface block to perform a predetermined treatment on the substrate to be sent when the substrate is sent from the adjacent treating block to the interface block; an unloading step of causing the interface block to unload the sent substrate into the external device; a loading and sending step of causing the interface block to load the substrate, subjected to the predetermined treatment by the external device, from the external device and to send the loaded substrate to the treating block on the second end; a second sending step of causing the treating blocks and the second indexer block to send the substrate, having been sent from the interface block, from the treating block on the second end to the first indexer block via the second indexer block; a second treating step of causing a treating block disposed between the first indexer block and the second indexer block to perform a predetermined treatment on the substrate to be sent when the substrate is sent from the treating block on the second end to the first indexer block; and a returning step of causing the first indexer block to return the sent substrate to a carrier placed on the first carrier platform.

With the substrate transporting method according to the present invention, the first carrier platform is disposed in the first indexer block, and the second carrier platform is disposed in the second indexer block. A currently-used carrier platform is provided only in the first indexer block. Accordingly, the substrate is transported between the first indexer block and the interface block in both the forward path and the return path. According to this aspect of the present invention, the substrate is sent from the second indexer block, disposed between the two treating blocks, to the interface block without being transported from the first indexer block in the forward path. Consequently, transportation process by the treating block disposed between the first indexer block and the second indexer block is reduced in the forward path. As a result, an entire throughput of the substrate treating apparatus can be enhanced.

Advantageous Effects of Invention

The substrate treating apparatus and the substrate transporting method according to the present invention achieves an enhanced throughput.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
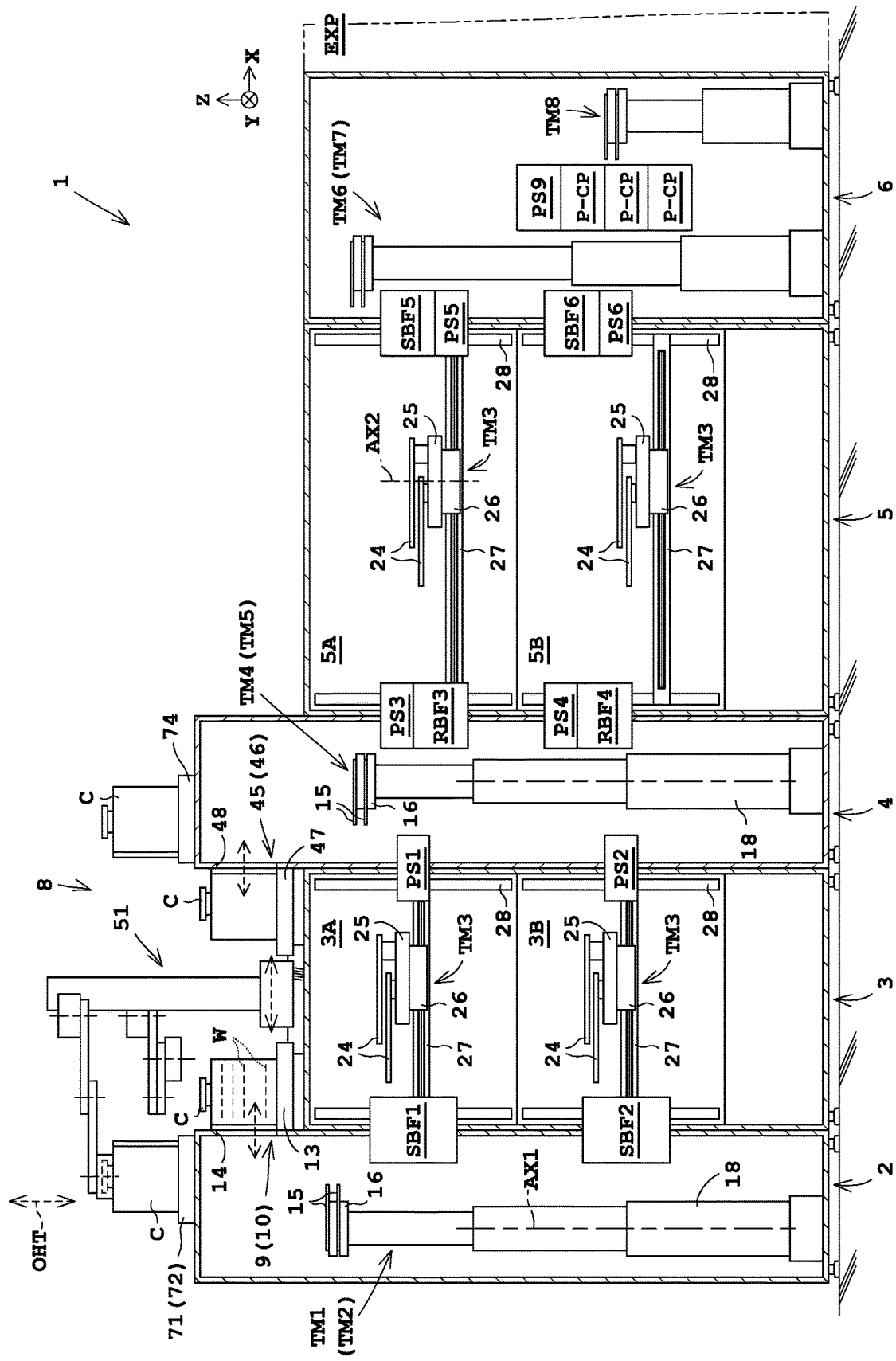
FIG. 1 is a longitudinal cross-sectional view of a substrate treating apparatus according to a first embodiment.
Figure 2:
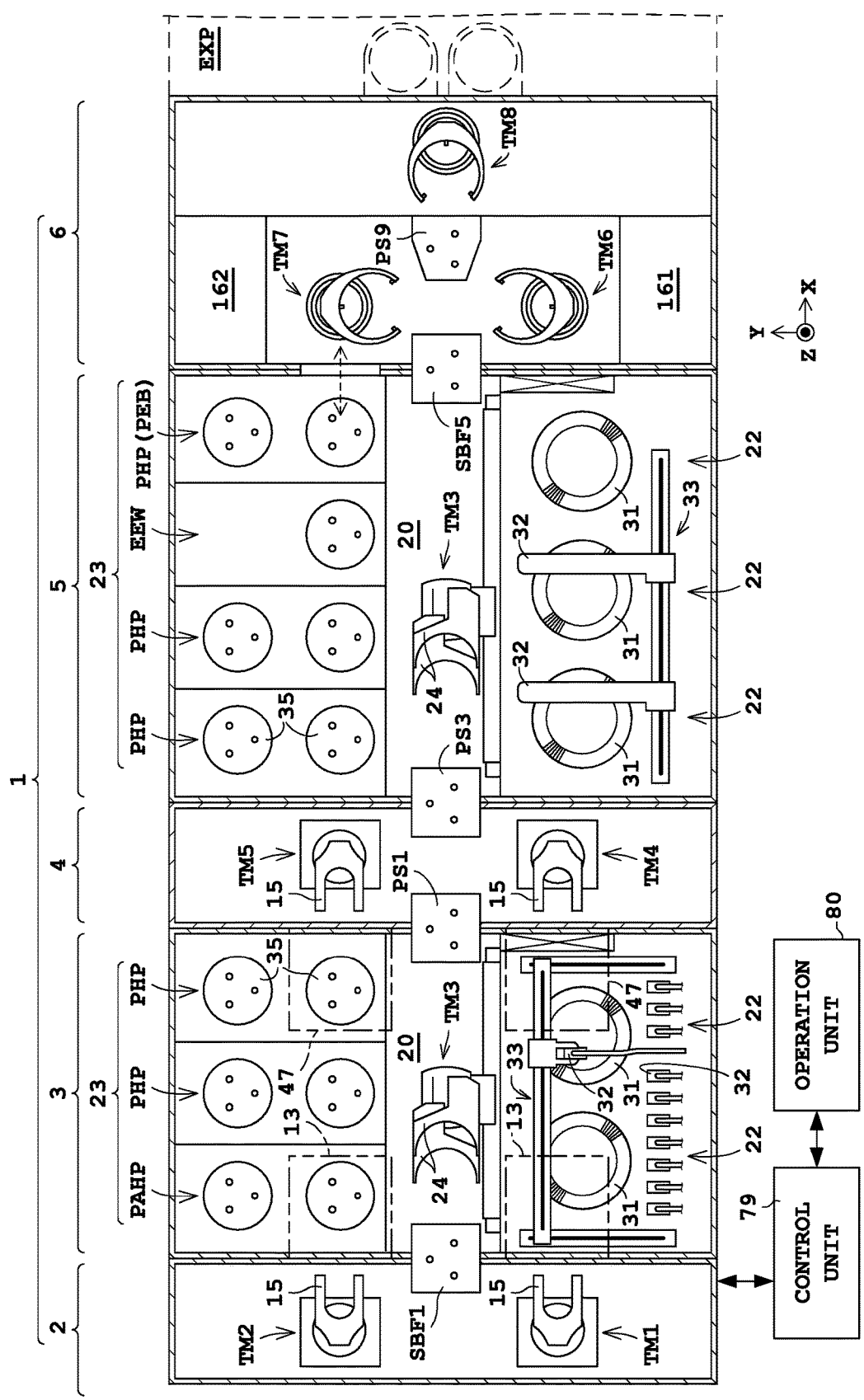
FIG. 2 is a horizontal cross-sectional view of the substrate treating apparatus according to the first embodiment.
Figure 3:
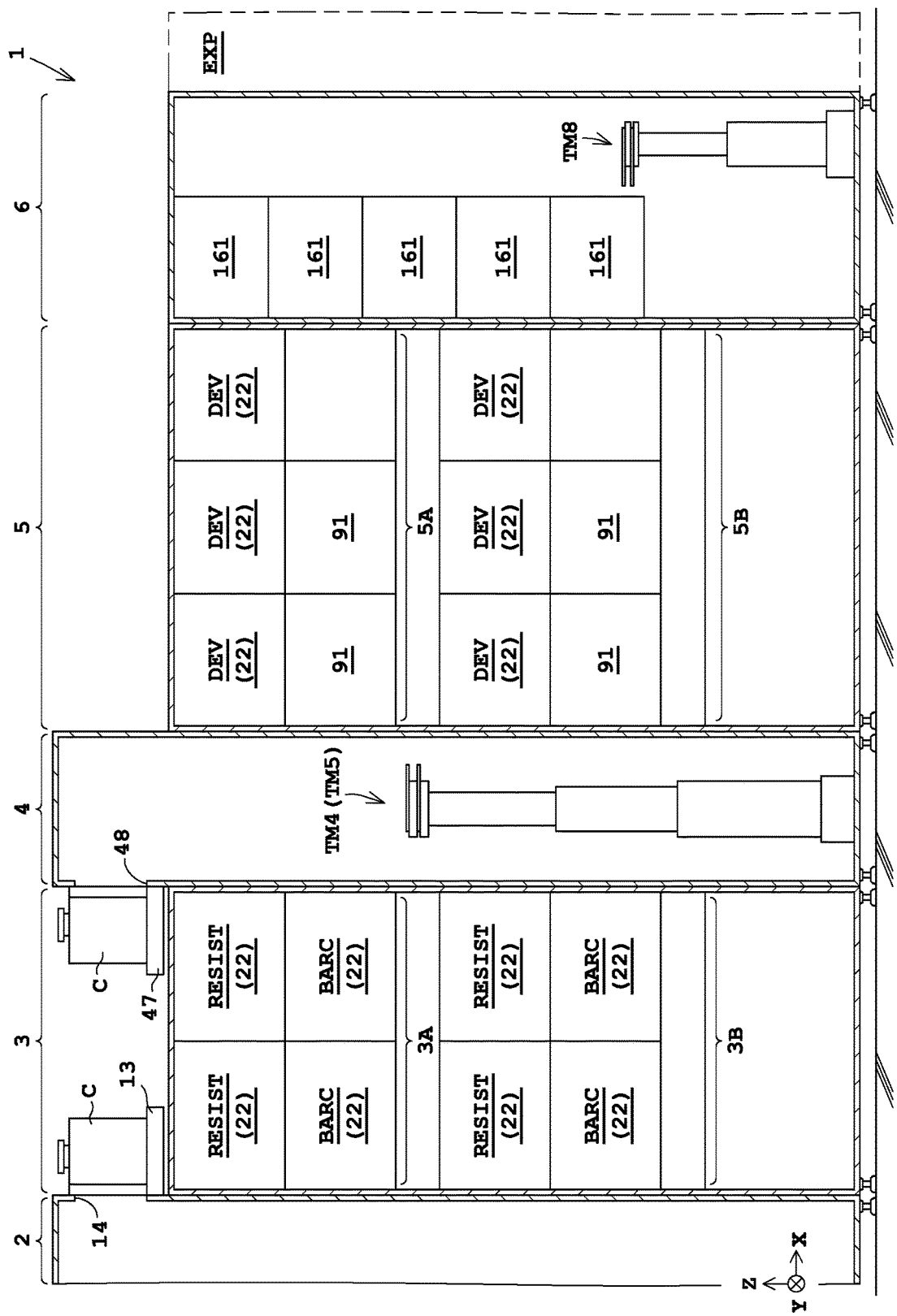
FIG. 3 is a right side view of the substrate treating apparatus according to the first embodiment.
Figure 4:
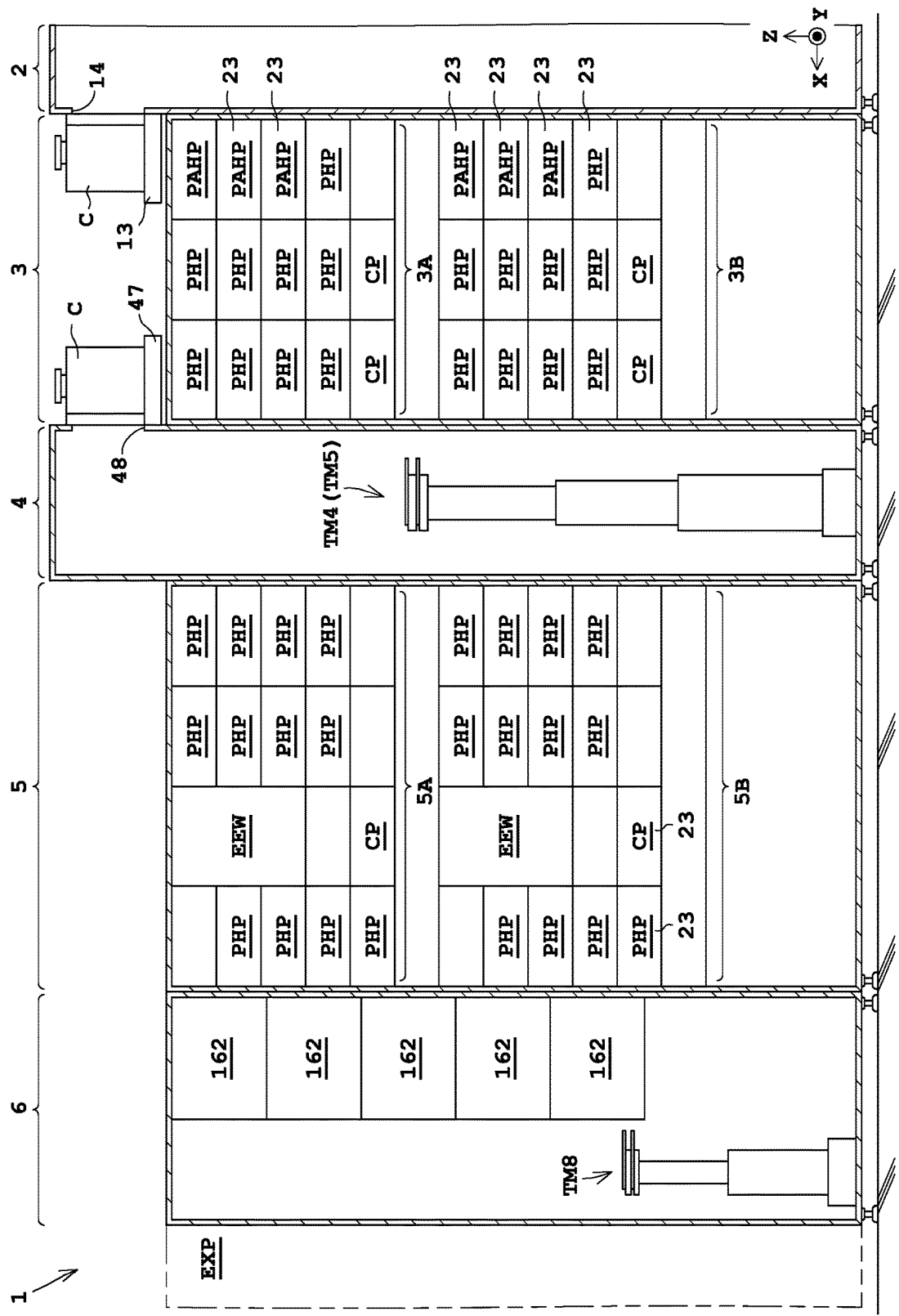
FIG. 4 is a left side view of the substrate treating apparatus according to the first embodiment.

A first embodiment of the present invention will now be described with reference to the drawings. FIG. 1 is a longitudinal cross-sectional view of a substrate treating apparatus according to a first embodiment. FIG. 2 is a horizontal cross-sectional view of the substrate treating apparatus. FIG. 3 is a right side view of the substrate treating apparatus. FIG. 4 is a left side view of the substrate treating apparatus.

<Configuration of Substrate Treating Apparatus 1>

Reference is made to FIG. 1 or 2. The substrate treating apparatus 1 includes a first indexer block (first ID block) 2, a coating block 3, a second indexer block (second ID block) 4, a developing block 5, an interface block (IF block) 6, and a carrier buffer device 8. An exposure device EXP is disposed adjacent to the IF block 6. The first ID block 2, the coating block 3, the second ID block 4, the developing block 5, the IF block 6, and the exposure device EXP are arranged linearly in a horizontal direction (X-direction).

Here in this embodiment, the coating block 3 corresponds to the first treating block of the present embodiment. The developing block 5 corresponds to the second treating block in the present invention. Moreover, the exposure device EXP corresponds to the external device in the present invention.

[Configuration of First Indexer Block 2]

The first ID block 2 includes two openers 9, 10 (see FIG. 6) and two substrate transport mechanisms TM1, TM2. The two openers (carrier mount tables) 9, 10 provided in the first ID block 2 each include a carrier C placed thereon that is capable of accommodating a plurality of substrates W.

The carrier C is capable of accommodating a plurality of (e.g., 25) substrates W in a horizontal orientation. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with an opening formed therein through which the substrates W are inserted or taken out and configured to accommodate the substrates W, and a lid for covering the opening of the carrier body.

The openers 9, 10 each include a platform 13 on which the carrier C is placed, an opening 14 through which the substrates W pass, a shutter (not shown) configured to open and close the opening 14 and to attach and detach the lid to and from the carrier body, and a shutter drive mechanism (not shown) configured to drive the shutter. The shutter drive mechanism includes an electric motor. Here, the shutter detaches the lid from the carrier body, and thereafter, moves downwardly or horizontally with respect to the opening 14 (Y-direction), for example.

The platforms 13 of the two openers 9, 10 are provided on the roof of the coating block 3. In FIG. 1, the platforms 13 are provided higher in level than the coating block 3, i.e., above the coating block 3. The platforms 13 may be provided on the coating block 3, i.e., may contact the coating block 3. The platform 13 corresponds to a first carrier platform of the present invention.

The substrate transport mechanisms TM1, TM2 include two hands 15, a forward/rearward driving unit 16, and a lifting/lowering rotation driving unit 18. Each of the two hands 15 holds the substrate W. Moreover, each of the two hands 15 is movably attached to the forward/rearward driving unit 16. The forward/rearward driving unit 16 is capable of moving the two hands 15 into the carrier C simultaneously. Moreover, the forward/rearward driving unit 16 is capable of moving the two hands 15 forward and backward individually. Accordingly, the forward/rearward driving unit 16 is capable of moving one of the two hands 15 into the carrier C.

The lifting/lowering rotation driving unit 18 lifts, lowers, and rotates the forward/rearward driving unit 16 to thereby lift, lower, and rotate the two hands 15. In other words, the lifting/lowering rotation driving unit 18 allows the forward/rearward driving unit 16 to move in an upward/downward direction (Z-direction) and to rotate the forward/rearward driving unit 16 about a vertical axis AX1. The forward/rearward driving unit 16 and the lifting/lowering rotation driving unit 18 each include an electric motor, for example. The substrate transport mechanisms TM1, TM2 are each fixed on a floor of the first ID block 2 individually so as not to move horizontally (especially, Y-direction). Note that the number of the hands 15 may be one or three or more, for example.

A feeding substrate buffer SBF1 is disposed between the first ID block 2 and an upper coating-treatment layer 3A of the coating block 3 mentioned later. A feeding substrate buffer SBF2 is disposed between the first ID block 2 and a lower coating-treatment layer 3B of the coating block 3 mentioned later. Each of the two feeding substrate buffers SBF1, SBF2 is configured to place the substrates W thereon.

The first substrate transport mechanism TM1 transports a substrate W from the carrier C placed on the platform 13 of the opener 9 to one of the two feeding substrate buffer SBF1 or SBF2. Moreover, the second substrate transport mechanism TM2 transports a substrate W from the carrier C placed on the platform 13 of the opener 10 to either the feeding substrate buffer SBF1 or SBF2. The two substrate transport mechanisms TM1, TM2 transport the substrate W to the two feeding substrate buffers SBF1, SBF2 alternately.

Here, the first substrate transport mechanism TM1 is capable of taking the substrate W from the carrier C of the opener 9, but is incapable of taking the substrate W from the carrier C of the opener 10. Moreover, the second substrate transport mechanism TM2 is capable of taking the substrate W from the carrier C of the opener 10, but is incapable of taking the substrate W from the carrier C of the opener 9.

[Configuration of Coating Block 3 and Developing Block 5]

The coating block 3 is connected to the first ID block 2. The coating block 3 performs a coating treatment. Moreover, the developing block 5 is connected to the second ID block 4. The developing block 5 performs a developing treatment.

The coating block 3 includes two (a plurality of) coating-treatment layers 3A, 3B arranged in the upward/downward direction (Z-direction). The developing block 5 includes two (a plurality of) developing-treatment layers 5A, 5B arranged in the upward/downward direction. The four treatment layers 3A, 3B, 5A, 5B each include a third substrate transport mechanism TM3, a transportation space 20 (see FIG. 2), a liquid treating unit 22, and a heat-treatment unit 23.

The third substrate transport mechanism TM3 is configured to transport the substrates W in each of the treatment layers 3A, 3B, 5A, 5B. The third substrate transport mechanism TM3 includes two hands 24, a forward/rearward driving unit 25, a rotation driving unit 26, a first movement mechanism 27, and a second movement mechanism 28.

Each of the two hands 24 holds the substrate W. Moreover, each of the two hands 24 is movably attached to the forward/rearward driving unit 25. The forward/rearward driving unit 25 moves the two hands 24 forward and backward individually. The rotation driving unit 26 causes the forward/rearward driving unit 25 to rotate about a vertical axis AX2. Accordingly, the orientation of each of the two hands 24 can be changed. The first movement mechanism 27 moves the rotation driving unit 26 in the forward/rearward direction (X-direction) as in FIG. 1. Accordingly, the forward/rearward driving unit 25 can be moved in the X-direction. The second movement mechanism 28 moves the first movement mechanism 27 in the upward/downward direction (Z-direction). Accordingly, the forward/rearward driving unit 25 can be moved in the Z-direction.

Each of the forward/rearward driving unit 25, the rotation driving unit 26, the first movement mechanism 27, and the second movement mechanism 28 includes an electric motor.

As illustrated in FIG. 2, the third substrate transport mechanism TM3 is disposed in the transportation space 20. The transportation space 20 is configured to extend in the horizontal direction (X-direction) linearly. The transportation space 20 is rectangular when seen from above the substrate treating apparatus 1. The liquid treating unit 22 and the heat-treatment unit 23 are disposed to sandwich the transportation space 20.

FIG. 3 is a right side view illustrating arrangement of the liquid treating units 22 in the coating block 3 and the developing block 5. Each of the two coating-treatment layers 3A, 3B includes four liquid treating units 22. The four liquid treating units 22 are arranged in two lines in the horizontal direction and two levels in the upward/downward direction, that is, the liquid treating units 22 are arranged in 2 lines×2 levels. Of the four liquid treating units 22, the lower two liquid treating units 22 are each a coating unit BARC. The upper two liquid treating units 22 are each a coating unit RESIST. The coating unit BARC forms an antireflection film on the substrate W. The coating unit RESIST forms a resist film, such as a photoresist, on the substrate W.

Each of the two developing-treatment layers 5A, 5B includes three liquid treating units 22. The three liquid treating units 22 are arranged in three lines×one levels. The heat-treatment units 22 are each arrangeable in three lines× two levels in the two developing-treatment layers 5A, 5B. The three liquid treating units 22 are each a developing unit DEV. The developing unit DEV develops the exposed substrate W.

As illustrated in FIG. 2, the liquid treating unit 22 includes a holding rotation portion 31, nozzles 32, and a nozzle moving mechanism 33. The holding rotation portion 31 holds substrates W by, for example, vacuum adsorption and rotates the substrates W held by the holding rotation portion 31 about the vertical axis (Z-direction). The rotation is performed by an electric motor, for example. The nozzles 32 are configured to supply a coating solution (e.g., a solution for forming an antireflection film or a photoresist solution) or a developer to the substrates W. The nozzle moving mechanism 33 moves the nozzles 32 to any positions. The nozzle moving mechanism 33 includes an electric motor, for example.

FIG. 4 illustrates arrangement of the heat-treatment units 23 in the coating block 3 and the developing block 5. Each of the four treatment layers 3A, 3B, 5A, 5B includes a plurality of heat-treatment units 23. The heat-treatment unit 23 performs a heat treatment, and includes a plate 35 (see FIG. 2) on which the substrate W is placed. For instance, the plate 35 is heated with a heater, and is cooled with a water-cooled mechanism.

The heat-treatment units 23 are arrangeable in three lines×five levels in the two coating-treatment layers 3A, 3B. In FIG. 4, each of the two coating-treatment layers 3A, 3B includes fourteen heat-treatment units 23. That is, each of the two coating-treatment layers 3A, 3B includes three adhesion enhancing treatment units PAHP, two cooling units CP, and nine heating/cooling units PHP.

Moreover, the heat-treatment units 23 are arrangeable in four lines×five levels in the two developing-treatment layers 5A, 5B. Each of the two developing-treatment layers 5A, 5B includes one cooling unit CP, twelve heating/cooling units PHP, and one edge exposing unit EEW. It should be noted that, in the coating block 3, the developing block 5, and the IF block 6, the number and types of the liquid treating units 22, the heat-treatment units 23, and other treating units are variable where appropriate.

The adhesion enhancing treatment units PAHP are configured to apply an adhesion enhancing agent such as hexamethyldisilazane (HMDS) to substrates W and heats the resulting substrates W to thereby enhance adhesion between the substrates W and the antireflection films. The adhesion enhancing treatment units PAHP also have the function of cooling the substrates W after heating. The cooling units CP cool the substrates W. The heating/cooling units PHP sequentially perform heating and cooling in this order. The edge exposing unit EEW exposes a peripheral edge of the substrate W.

[Configuration of Second Indexer Block 4]

As illustrated in FIG. 1, the second ID block 4 is connected to the coating block 3, and the second ID block 4 is connected to the developing block 5. That is, the second ID block 4 is disposed between the coating block 3 and the developing block 5.

The second ID block 4 includes two openers 45, 46 (see FIG. 6) and two substrate transport mechanisms TM4, TM5. The two openers 45, 46 provided in the second ID block 4 each include a carrier C placed thereon that is capable of accommodating a plurality of substrates W.

Similarly to the opener 9, the openers 45, 46 each include a platform 47 on which the carrier C is placed, an opening 48 through which the substrates W pass, a shutter (not shown) configured to open and close the opening 48 and to attach and detach the lid to and from the carrier body, and a shutter drive mechanism configured to drive the shutter. The shutter drive mechanism includes an electric motor. Here, the shutter detaches the lid from the carrier body, and thereafter, moves downwardly or horizontally with respect to the opening 48, for example.

The platform 47 is provided on the roof of the coating block 3. In FIG. 1, the platform 47 is provided higher in level than the coating block 3, i.e., above the coating block 3. The platform 47 may be provided on the coating block 3, i.e., may contact the coating block 3. The platform 47 corresponds to a second carrier platform of the present invention.

The substrate transport mechanisms TM4, TM5 each include two hands 15, a forward/rearward driving unit 16, and a lifting/lowering rotation driving unit 18. The substrate transport mechanisms TM4, TM5 are each configured in the same manner as that of the substrate transport mechanism TM1 (TM2).

A substrate platform PS1 is disposed between the upper coating-treatment layer 3A and the second ID block 4. A substrate platform PS2 is disposed between the lower coating-treatment layer 3B and the second ID block 4. A substrate platform PS3 and a return substrate buffer RBF3 are disposed between the second ID block 4 and an upper developing-treatment layer 5A. Moreover, a substrate platform PS4 and a return substrate buffer RBF4 are disposed between the second ID block 4 and a lower developing-treatment layer 5B.

The fourth substrate transport mechanism TM4 is capable of transporting a substrate W among the four substrate platforms PS1 to PS4, the two return substrate buffers RBF3, RBF4, and the carrier C placed on the platform 47 of the opener 45. Moreover, the fourth substrate transport mechanism TM4 is capable of taking and accommodating a substrate W from and into the carrier C placed on the opener 45 (see FIG. 6). However, the fourth substrate transport mechanism TM4 is incapable of taking and accommodating a substrate W from and into the carrier C placed on the opener 46.

The fifth substrate transport mechanism TM5 is capable of transporting a substrate W among the four substrate platforms PS1 to PS4, the two return substrate buffers RBF3, RBF4, and the carrier C placed on the platform 47 of the opener 46. Moreover, the fifth substrate transport mechanism TM5 is capable of taking and accommodating a substrate W from and into the carrier C placed on the opener 46 (see FIG. 6). However, the fifth substrate transport mechanism TM5 is incapable of taking and accommodating a substrate W from and into the carrier C placed on the opener 45.

[Interface Block (IF Block) 6]

The IF block 6 is connected to the developing block 5. The IF block 6 loads and unloads the substrate W into and from the exposure device EXP that is configured to perform an exposure treatment as a third treatment. The IF block 6 includes three substrate transport mechanisms TM6 to TM8, a plurality of pre-exposure cleaning units 161, a plurality of post-exposure cleaning units 162, three mounting-cum-cooling units P-CP, and a substrate platform PS9 (see FIGS. 1 to 4).

The sixth substrate transport mechanism TM6 and a seventh substrate transport mechanism TM7 are disposed in a Y-direction perpendicular with respect to the forward/rearward direction (X-direction). An eighth substrate transport mechanism TM8 is disposed rearward of the two substrate transport mechanisms TM6, TM7 (right side of FIG. 1). The pre-exposure cleaning unit 161 faces the post-exposure cleaning unit 162 across the two substrate transport mechanisms TM6, TM7. The pre-exposure cleaning unit 161 cleans and dries the substrate W prior to an exposure treatment. The post-exposure cleaning unit 162 cleans and dries the substrate W subsequent to the exposure treatment. Each of the cleaning units 161, 162 includes a holding rotation portion configured to hold the substrate W, and nozzles through which such as a cleaning liquid or a rinse liquid is dispensed to the substrate W. Moreover, each of the cleaning units 161, 162 may perform polishing to a back face and an edge (bevel portion) of the substrate W with use of a brush and the like. Here, the back face of the substrate W is a face opposite to the face where circuit patterns are formed, for example.

Three mounting-cum-cooling units P-CP and one substrate platform PS9 are surrounded by the three substrate transport mechanisms TM6 to TM8. The three mounting-cum-cooling units P-CP and the one substrate platform PS9 are arranged in the upward/downward direction. A feeding substrate buffer SBF5 and a substrate platform PS5 are disposed between the upper developing-treatment layer 5A and the IF block 6. A feeding substrate buffer SBF6 and a substrate platform PS6 are disposed between the lower developing-treatment layer 5B and the IF block 6.

The sixth substrate transport mechanism TM6 is capable of transporting a substrate W among the two feeding substrate buffers SBF5, SBF6, the three substrate platforms PS5, PS6, PS9, the three mounting-cum-cooling units P-CP, and the pre-exposure cleaning unit 161.

The seventh substrate transport mechanism TM7 is capable of transporting a substrate W among the two feeding substrate buffers SBF5, SBF6, the three substrate platforms PS5, PS6, PS9, the three mounting-cum-cooling units P-CP, and the post-exposure cleaning unit 162. Moreover, the seventh substrate transport mechanism TM7 is capable of delivering and receiving the substrate W to and from the eight in total heating/cooling units PHP (see FIGS. 2, 4) arranged adjacent to the IF block 6 in the upward/downward direction not via other components, such as the feeding substrate buffer SBF5 and the substrate platform PS5, but directly.

The eighth substrate transport mechanism TM8 is capable of transporting a substrate W among the substrate platform PS9, the three mounting-cum-cooling units P-CP, and the exterior exposure device EXP. Each of the three substrate transport mechanisms TM6 to TM8 is configured in substantially the same manner as that of the first substrate transport mechanism TM1 (TM2), and thus the description thereof is to be omitted. Note that the substrate platforms PS1 to PS6, PS9 may place on only one substrate W or a plurality of substrates W thereon.

[Carrier Buffer Device 8]

The substrate treating apparatus 1 includes a carrier buffer device 8 placed on or above the first ID block 2, the coating block 3 and the second ID block 4, for example. The carrier buffer device 8 includes a carrier transport mechanism 51 and a carrier storage shelf 53 (see FIG. 6).

Figure 5:
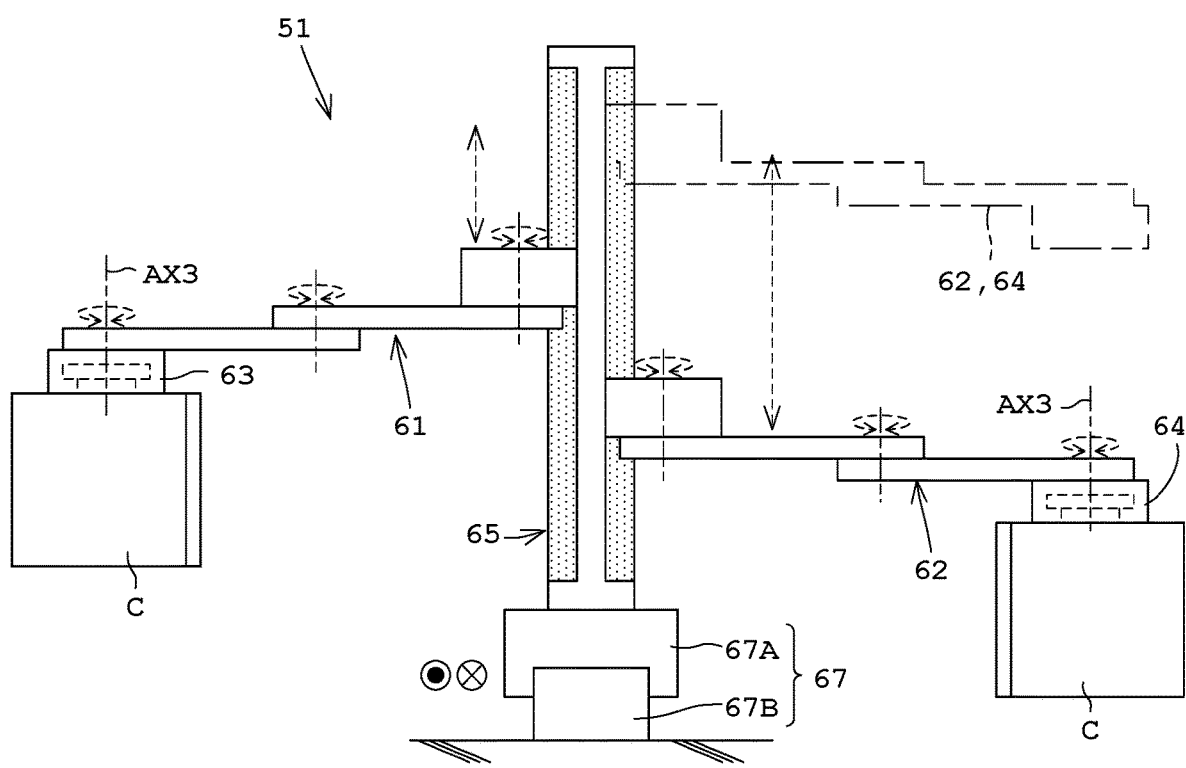
FIG. 5 illustrates a carrier transport mechanism.

Reference is made to FIG. 5. FIG. 5 illustrates the carrier transport mechanism 51. The carrier transport mechanism 51 includes two articulated arms 61, 62. A first articulated arm 61 includes a first end with a gripper 63, and a second articulated 62 includes a first end with a gripper 64. Moreover, the first articulated arm 61 includes a second end supported on a strut lifting/lowering driving unit 65 so as to be movable in the upward/downward direction. The second articulated arm 62 includes a second end supported on the lifting/lowering driving unit 65 so as to be movable in the upward/downward direction.

Each of the two grippers 63, 64 is configured to grasp a projection provided on a top face of the carrier C, for example. The two grippers 63, 64 each include an electric motor.

The two articulated arms 61, 62 each include one electric motor or two or more electric motors. The first articulated arm 61 is configured to cause the first gripper 63 to be rotatable to 360 degrees about a vertical axis AX3. The second articulated arm 62 is configured in the same manner as the first articulated arm 61. For instance, the first articulated arm 61 may be in charge of transporting the carrier C on the upper side (adjacent to the openers 10, 46) in FIG. 6, whereas the second articulated arm 62 may be in charge of transporting the carrier C on the lower side (adjacent to the openers 9, 45) in FIG. 6.

The lifting/lowering driving unit 65 is configured to cause the two articulated arms 61, 62 to be liftable individually.

The lifting/lowering driving unit 65 includes an electric motor. The lifting/lowering driving unit 65 may include a belt and two or more pulleys, for example, for one articulated arm.

A forward/backward driving unit 67 includes a supporting portion 67A configured to support the lifting/lowering driving unit 65, a longitudinal portion 67B extending longitudinally in the forward/rearward direction (X-direction), and an electric motor (not shown). For instance, the longitudinal portion 67B may be a rail (guide rail) and the supporting portion 67A may be a carriage. In this case, the electric motor may cause the carriage (supporting portion 67A) to move along the rail (longitudinal portion 67B).

Moreover, the electric motor, the two or more pulleys, the belt, and the guide rail may be accommodated in the longitudinal portion 67B, and the supporting portion 67A may be fixed to the belt, for example. In this case, the electric motor may cause the pulleys to rotate to move the belt on the pulleys, whereby supporting portion 67A is moved along the guide rail.

Figure 6:
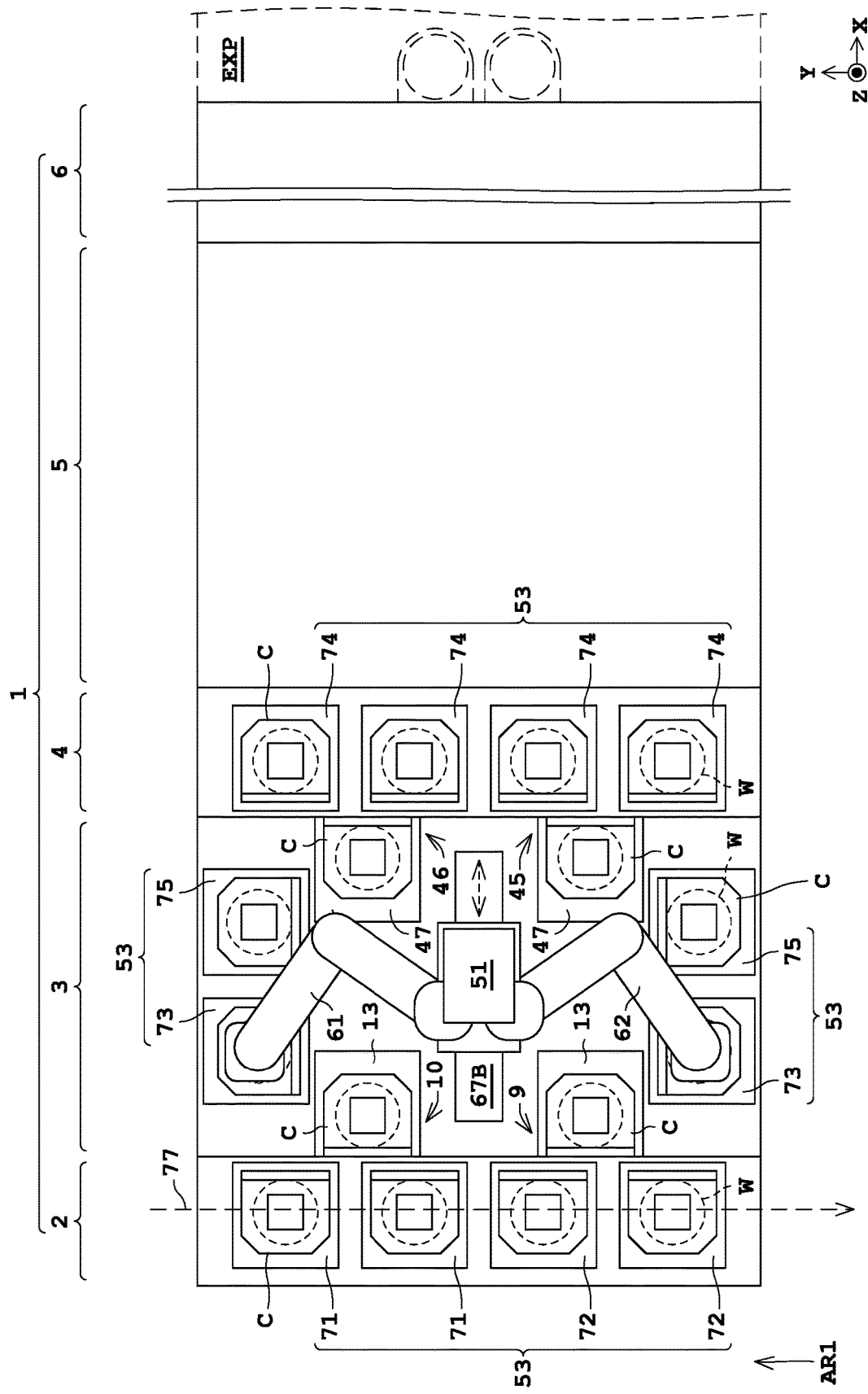
FIG. 6 illustrates a carrier buffer device.

Reference is made to FIG. 6. The carrier storage shelf 53 includes input ports 71, output ports 72, untreated substrate carrier shelves 73, empty carrier shelves 74, and treated substrate carrier shelves 75. The input ports 71 are each a shelf for receiving the carrier C where untreated substrates W are accommodated from an external transport mechanism OHT (Overhead Hoist Transport). The external transport mechanism OHT transports a carrier C in the factory. The term untreated means the condition where neither the coating block 3 nor the developing block 5 performs any treatment on the substrate. As illustrated in FIGS. 1 and 6, the input port 71 is provided on the ID block 2, i.e., on the roof of the ID block 2. A rail 77 for the external transport mechanism OHT is provided above the ID block 2. The external transport mechanism OHT transports a carrier C to one of the two input ports 71.

Moreover, as illustrated in FIG. 6, the untreated substrate carrier shelves 73, the empty carrier shelves 74, and the treated substrate carrier shelves 75 are arranged along the longitudinal portion 67B in a longitudinal direction of the substrate treating apparatus 1. The untreated substrate carrier shelf 73 accommodates a carrier C which is placed on the input port 71, the carrier C incapable of being transported to either of the two platforms 13, and accommodating untreated substrates W. The empty carrier shelf 74 accommodates a carrier C from which all the substrates W are taken out on the platform 13, and which is incapable of being transported to either of the two platforms 47. The treated substrate carrier shelf 75 accommodates a carrier C accommodating the treated substrates W and incapable of being transported to either of the two output ports 72. In this embodiment, the term treated means the condition where the coating block 3 and the developing block 5 performed treatment on the substrate.

The output port 72 is a shelf for delivering a carrier C where the treated substrates W are accommodated to the external transport mechanism OHT. As illustrated in FIGS. 1 and 6, the output port 72 is provided on the ID block 2, i.e., on the roof of the ID block 2. The carrier transport mechanism 51 allows a carrier C to move freely among the platforms 13, 47 and the shelves 71 to 75.

Moreover, as illustrated in FIGS. 1 and 6, the platform 13 and the opening 14 (openers 9, 10) are disposed adjacent to the coating block 3, and the platform 47 and the opening 48 (openers 45, 46) are disposed adjacent to the coating block 3. In other words, the platform 13 and the platform 47 are disposed so as to face each other. Accordingly, the platform 13 and the platform 47 face the carrier transport mechanism 51, whereby the carrier transport mechanism 51 can transport the carrier C easily. Moreover, if the platform is disposed opposite to the coating block 3 (see the arrow AR1 in FIG. 6) across the ID block 2 in a currently-used manner, the platform 13 protrudes, for example. In contrast to this, since the platform 13 and the platform 47 are disposed so as to face each other, protrusion of the platform 13 can be prevented. As a result, reduction in footprint of the substrate treating apparatus 1 is obtainable.

The carrier transport mechanism 51 includes the two-paired articulated arms and grippers. Alternatively, one-paired articulated arm and gripper, or three or more paired articulated arms and grippers may be provided. Moreover, the lifting/lowering driving unit 65 may be configured to be rotatable about a vertical axis with respect to the supporting portion 67A. Moreover, a rail 77 may pass an area other than the area above the first ID block 2. In this case, an input port 71 and an output port 72 are provided at a position on the apparatus 1 where the rail 77 passes above the apparatus 1. The number and types of the carrier storage shelves 53 are variable where appropriate.

Moreover, as illustrated in FIG. 2, the substrate treating apparatus 1 includes one or more control units 79 and an operation unit 80. Each of the control units 79 includes, for example, a central processing unit (CPU). The control units 79 control components of the substrate treating apparatus 1. The operation unit 80 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

<Operation of Substrate Treating Apparatus 1>

An operation of the substrate treating apparatus 1 will now be described. It should be noted that a plurality of processes performed in the substrate treating apparatus 1 is one example, and an operator selects a required process from them. Reference is made to FIG. 1. The external transport mechanism OHT transports a carrier C to the input ports 71 provided on the first ID block 2. The carrier transport mechanism 51 transports the carrier C from the input port 71 to the platform 13 of the opener 9, for example. The shutter of the opener 9 opens the opening 14 while removing and holding the lid of the carrier C.

[Step S01] First ID Block 2

The first substrate transport mechanism TM1 of the first ID block 2 takes a substrate W from the carrier C placed on the carrier platform 13 of the opener 9, and transports the taken substrate W to the coating block 3. For instance, the first substrate transport mechanism TM1 transports the substrate W taken from the carrier C to the two feeding substrate buffers SBF1, SBF2 alternately. Here, the second substrate transport mechanism TM2 takes a substrate W from the carrier C placed on the carrier platform 13 of the opener 10, and transports the taken substrate W to the coating block 3.

When all the substrates W are taken from the carrier C, the opener 9 closes the opening 14 with the shutter while attaching the lid to the carrier C. Thereafter, the carrier transport mechanism 51 replaces the empty carrier C, from which the substrates W are taken out, by another carrier C accommodating untreated substrates W. Thereafter, the carrier transport mechanism 51 transports the empty carrier C to the platform 47 of the opener 45, for example. If the empty carrier C is incapable of being transported to either the opener 45 or 46, the carrier transport mechanism 51 transports the empty carrier C to the empty carrier shelf 74.

[Step S02] Coating Block 3

The coating block 3 performs a coating treatment on the substrate W sent from the first ID block 2, and sends the substrate W subjected to the coating treatment to the second ID block 4. Detailed description is as under.

In the coating-treatment layer 3A of the coating block 3, for example, the third substrate transport mechanism TM3 receives a substrate W from the feeding substrate buffer SBF1. The third substrate transport mechanism TM3 transports the received substrate W to an adhesion enhancing treatment unit PAHP, a cooling unit CP, and a coating unit BARC, illustrated in FIGS. 3 and 4, in this order. Thereafter, the third substrate transport mechanism TM3 transports the substrate W on which an antireflection film is formed by the coating unit BARC, to a heating/cooling unit PHP, a cooling unit CP, a coating unit RESIST, and a heating/cooling unit PHP in this order. The third substrate transport mechanism TM3 transports the substrate W on which a resist film is formed by the coating unit RESIST to the substrate platform PS1. It should be noted that a process by the adhesion enhancing treatment unit PAHP is omittable. Moreover, the same treatment is performed in the coating-treatment layer 3B as in the coating-treatment layer 3A.

[Step S03] Second ID Block 4

The second ID block 4 transports the substrate W, sent from the coating block 3, to the developing block 5. Specifically, one of the two substrate transport mechanisms TM4, TM5 of the second ID block 4 receives the substrate W from the substrate platform PS1, and transports the received substrate W to the substrate platform PS3, for example. It should be noted that transportation of the received substrate W to the substrate platform PS4 is performable. Moreover, one of the two substrate transport mechanisms TM4, TM5 transports the substrate W from the substrate platform PS2 to the substrate platform PS4.

[Step S04] Developing Block 5

The developing block 5 transports the substrate W, sent from the second ID block 4, to the IF block 6 without performing any developing treatment on the substrate W subjected to the coating treatment. Specifically, the third substrate transport mechanism TM3 in the upper developing-treatment layer 5A receives the substrate W from the substrate platform PS3, and transports the received substrate W to the feeding substrate buffer SBF5.

[Step S05] IF Block 6

The IF block 6 unloads the substrate W sent from the developing block 5 into the exposure device EXP. Thereafter, the IF block 6 loads the substrate W subjected to the exposure treatment from the exposure device EXP, and transports the substrate W subjected to the exposure treatment to the developing block 5. Detailed description is as under.

The sixth substrate transport mechanism TM6 in the IF block 6 receives the substrate W from the feeding substrate buffer SBF5, and transports the received substrate W to the pre-exposure cleaning unit 161 and the mounting-cum-cooling unit P-CP in this order. The eighth substrate transport mechanism TM8 transports the substrate W from the mounting-cum-cooling unit P-CP to the exposure device EXP. The exposure device EXP performs the exposure treatment on the transported substrate W.

The eighth substrate transport mechanism TM8 transports the substrate W exposed by the exposure device EXP from the exposure device EXP to the substrate platform PS9. The seventh substrate transport mechanism TM7 receives the substrate W from the substrate platform PS9, and transports the received substrate W to the post-exposure cleaning unit 162. Thereafter, the seventh substrate transport mechanism TM7 transports the substrate W directly to the heating/cooling unit PHP, for example, in the developing-treatment layer 5A of the developing block 5. The heating/cooling unit PHP in the developing-treatment layer 5A performs post-exposure baking (PEB). Moreover, the seventh substrate transport mechanism TM7 transports the substrate W from the post-exposure cleaning unit 162 to the upper developing-treatment layer 5A or the lower developing-treatment layer 5B alternately.

Here, the seventh substrate transport mechanism TM7 transports the substrate W directly to the heating/cooling unit PHP in the developing block 5. In this regard, the seventh substrate transport mechanism TM7 may transport the substrate W to the substrate platform PS5 (PS6), and the third substrate transport mechanism TM3 in the developing-treatment layer 5A (5B) may transport the substrate W from the substrate platform PS5 (PS6) to the heating/cooling unit PHP, for example.

[Step S06] Developing Block 5

The developing block 5 performs the developing treatment on the substrate W subjected to the exposure treatment, and sends the substrate W subjected to the developing treatment to the second ID block 4. Detailed description is as under. For instance, the third substrate transport mechanism TM3 in the developing-treatment layer 5A receives the substrate W from the heating/cooling unit PHP, and transports the received substrate W to the cooling unit CP, the developing unit DEV, the heating/cooling unit PHP, and the return substrate buffer RBF3 in this order. It should be noted that a process by the heating/cooling unit PHP after the treatment by the developing unit DEV is omittable. Moreover, the same treatment is performed in the developing-treatment layer 5B as in the developing-treatment layer 5A.

[Step S07] Second ID Block 4

The second ID block 4 returns the developed substrate W to a carrier C placed on the platform 47 of the opener 45. Detailed description is as under. The carrier C on the platform 47 includes the opening kept in an opened state by the opener 45. The fourth substrate transport mechanism TM4 receives the substrate W from the return substrate buffer RBF3 (RBF4), and returns the received substrate W to the carrier C placed on the platform 47 of the opener 45. Here, the substrate W is returned to the carrier C where the substrate W was accommodated prior to the coating and developing treatments. In other words, the substrate W is returned to the first carrier C. Moreover, the substrate W is returned to the carrier C placed on the platform 47 of the opener 46 with use of the fifth substrate transport mechanism TM5.

When all the treated substrates W are accommodated in the carrier C, the opener 45 closes the opening 48 while attaching the lid to the carrier C. The carrier transport mechanism 51 transports the carrier C where the treated substrates W are accommodated from the platform 47 of the opener 45 to the output port 72. Thereafter, the external transport mechanism OHT transports the carrier C from the output port 72 to a next target.

Figure 7:
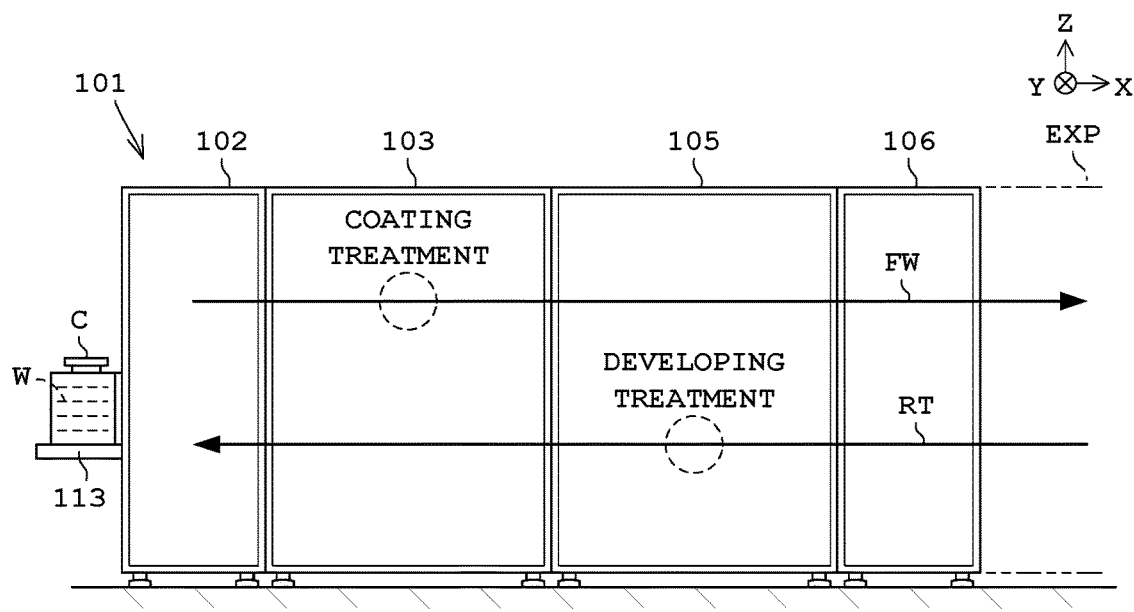
FIG. 7 illustrates operation of a currently-used substrate treating apparatus.

FIG. 7 illustrates operation of a currently-used substrate treating apparatus 101. The currently-used substrate treating apparatus 101 transports a substrate W to an ID block 102, a coating block 103, a developing block 105, and an IF block 106 in this order (forward path FW). At this time, the coating block 103 performs a coating process to the substrate W while the developing block 105 does not perform a developing process to the substrate W. Moreover, the substrate treating apparatus 101 transports the exposed substrate W to the IF block 106, the developing block 105, the coating block 103, and the ID block 102 in this order (return path RT). At this time, the coating block 103 does not perform any coating treatment on the substrate W while the developing block 105 performs the developing treatment on the substrate W.

Figure 8:
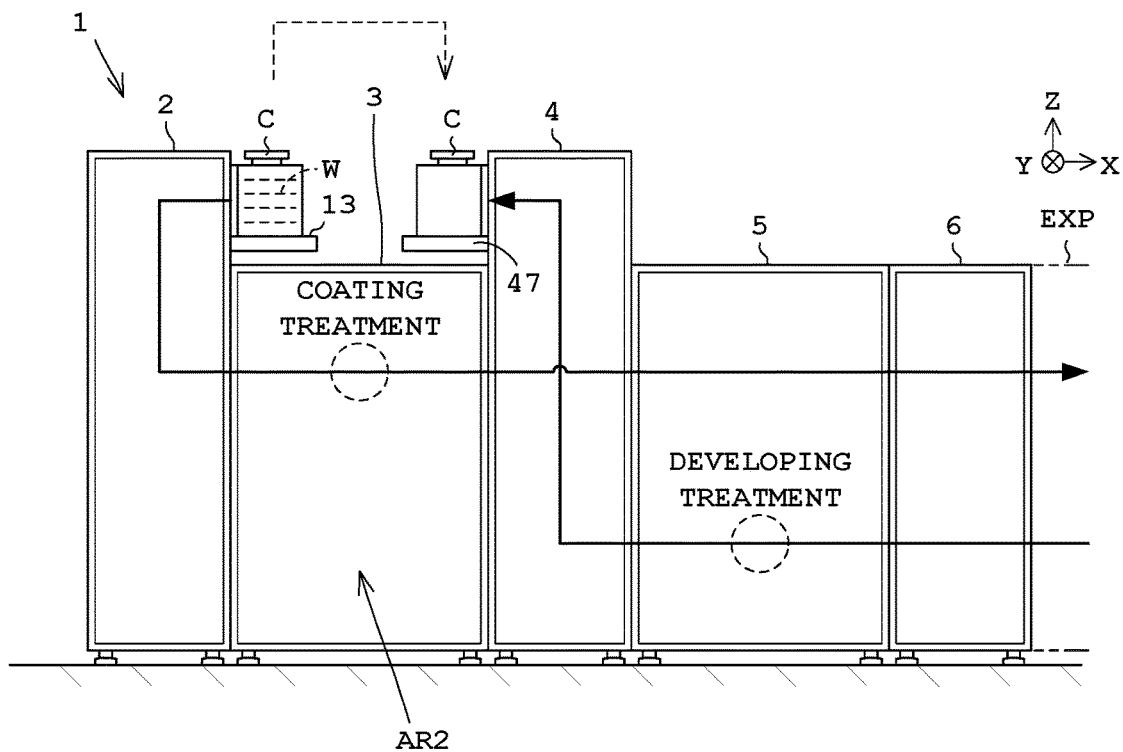
FIG. 8 illustrates operation of the substrate treating apparatus according to the first embodiment.

According to this embodiment, the first ID block 2, the coating block 3, the second ID block 4, the developing block 5, and the IF block 6 are arranged in this order as in FIG. 8. A platform 13 is placed on a first ID block 2, and a platform 47 is placed on a second ID block 4. Conventionally, as illustrated in FIG. 7, the carrier platform 113 is placed on only the first ID block 102. Accordingly, the substrate W is transported in both the forward path FW and the return path RT between the first ID block 102 and the IF block 106. According to this embodiment, the substrate W is transported from the IF block 6 to the second ID block 4 disposed between the coating block 3 and the developing block 5 in the return path without being transported from the IF block 6 to the first ID block 2. Consequently, the transportation process in the return path by the coating block 3 disposed between the first ID block 2 and the second ID block 4 is reduced as illustrated by the arrow AR2 in FIG. 8. That is, one step among the transportation step is reduced. Reduction by one step achieves another step in the transportation process. As a result, an entire throughput of a substrate treating apparatus 1 can be enhanced.

Moreover, the substrate treating apparatus 1 further includes a carrier transport mechanism 8 configured to transport a carrier C between the platform 13 and the platform 47 as in FIG. 1. For instance, when all the substrates W are taken from the carrier C placed on the platform 13, the carrier transport mechanism 8 is capable of transporting the carrier C placed on the platform 13 to the platform 47 in order to return the substrates W to the carrier C.

Moreover, a currently-used carrier transport mechanism is disposed horizontally with respect to the ID block 2. With the configuration of this embodiment, the carrier transport mechanism 8 is mounted on the coating block 3. Accordingly, an installation area of the currently-used carrier transport mechanism disposed horizontally with respect to the ID block 2 can be decreased. In other words, reduction in footprint of the substrate treating apparatus 1 is obtainable.

Moreover, the substrate treating apparatus 1 includes the carrier storage shelf 53 mounted on the first ID block 2, the coating block 3, and the second ID block 4. The carrier transport mechanism 8 transports a carrier C among the platforms 13, 47 and the carrier storage shelf 53. A currently-used carrier storage shelf 53 is disposed horizontally with respect to the ID block 2. With the configuration of this embodiment, the carrier storage shelf 53 is mounted on the coating block 3. Accordingly, an installation area of the currently-used carrier storage shelf disposed horizontally with respect to the ID block 2 can be decreased. In other words, reduction in footprint of the substrate treating apparatus 1 is obtainable.

Here in this embodiment, the coating block 3 and the developing block 5 each include the two treatment layers. In this regard, the coating block 3 and the developing block 5 may each include a single treatment layer, or three or more treatment layers.

SECOND EMBODIMENT

A second embodiment of the present invention will now be described with reference to the drawings. Here, the description common to that of the first embodiment is to be omitted.

In the first embodiment, the substrate treating apparatus 1 takes a substrate W from the carrier C placed on the platform 13 of the first ID block 2 illustrated on the left side of FIG. 1, and accommodates the substrate W into the carrier C placed on the platform 47 of the second ID block 4 illustrated on the right side of FIG. 1. In this regard, such tasks are replaceable with each other. That is, the substrate treating apparatus 1 may take a substrate W from the carrier C placed on the platform 47 of the second ID block 4 illustrated on the right side of FIG. 1, and may accommodate the substrate W into the carrier C placed on the platform 13 of the first ID block 2 illustrated on the left side of FIG. 1.

Figure 9:
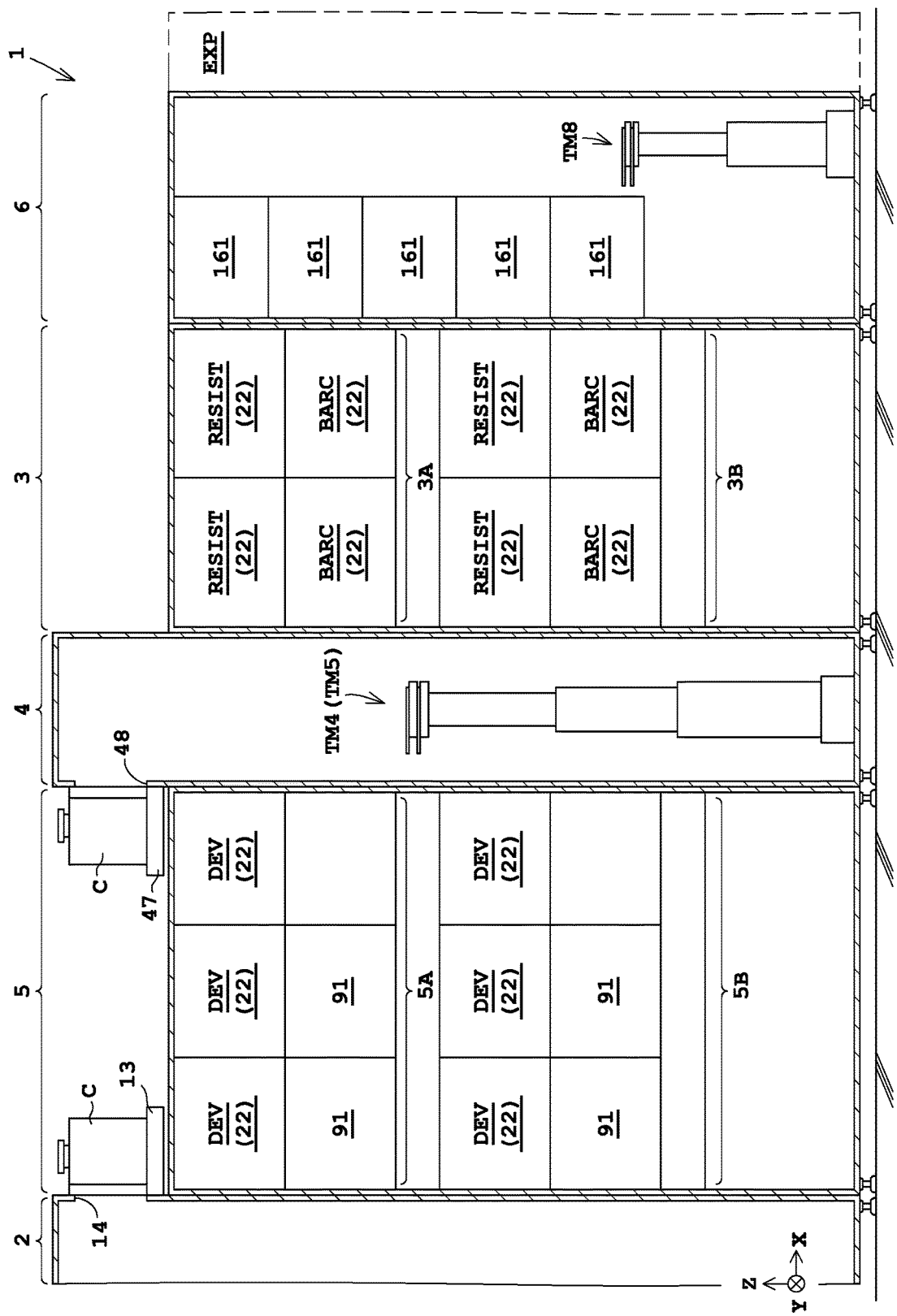
FIG. 9 is a right side view of a substrate treating apparatus according to a second embodiment.

FIG. 9 is a right side view illustrating arrangement of a liquid treating units 22 in a coating block 3 and a developing block 5 of a substrate treating apparatus 1 according to the second embodiment. The substrate treating apparatus 1 according to this embodiment includes the coating block 3 and the developing block 5 of whose arrangement is illustrated in a reversed manner from that of the substrate treating apparatus 1 in FIG. 1. The first ID block 2, the developing block 5, the second ID block 4, the coating block 3, and the IF block 6 are arranged in this order linearly. The substrate treating apparatus 1 in this embodiment includes substantially the same configuration as that of the substrate treating apparatus 1 in the first embodiment.

Here in this embodiment, the developing block 5 corresponds to the first treating block of the present embodiment. Moreover, the developing treatment corresponds to the first treatment in the present invention. The coating block 3 corresponds to the second treating block in the present invention. Moreover, the coating treatment corresponds to the second treatment in the present invention.

<Operation of Substrate Treating Apparatus 1>

Figure 10:
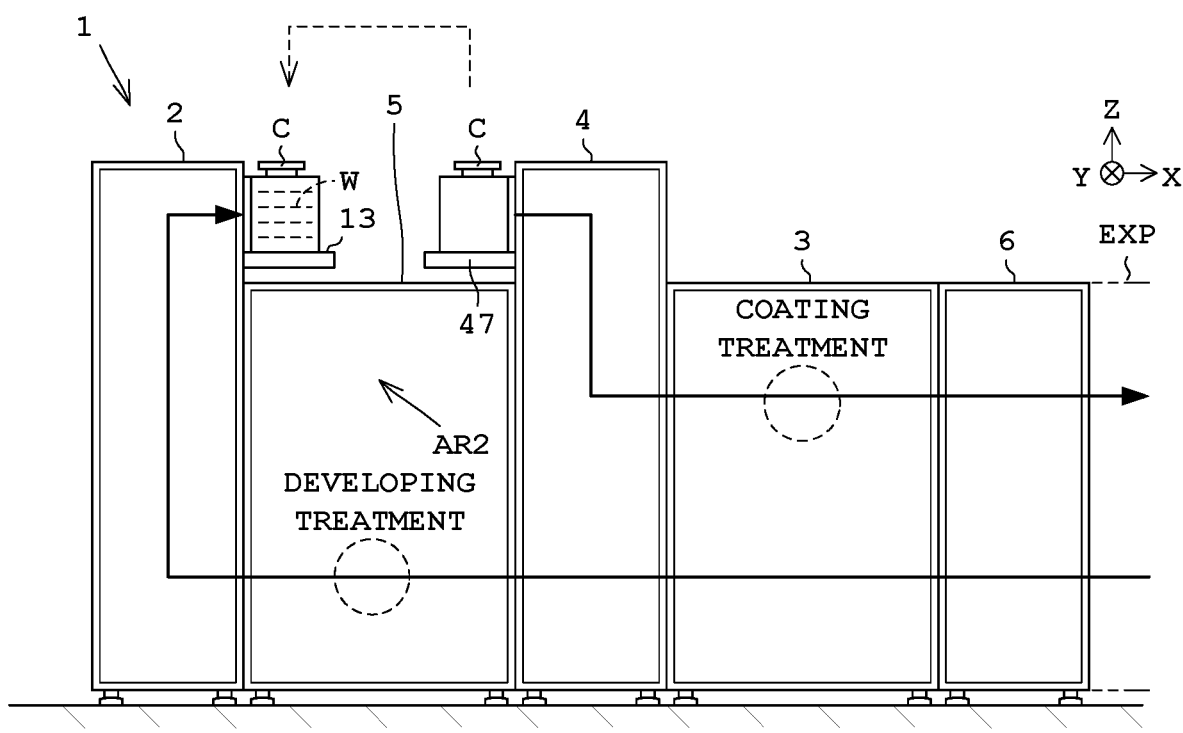
FIG. 10 illustrates operation of the substrate treating apparatus according to the second embodiment.

An operation of the substrate treating apparatus 1 according to this embodiment will now be described. FIG. 10 illustrates operation of the substrate treating apparatus 1. Here, as illustrated in FIG. 10, the coating block 3 and the developing block 5 are each configured in a single treatment layer for easy description of its operation.

Reference is made to FIG. 10. The second ID block 4 takes a substrate W from the carrier C placed on the carrier platform 47 of any of two openers 45, 46 (see FIG. 6), and transports the taken substrate W to the coating block 3. Thereafter, the coating block 3 performs a coating treatment on the substrate W sent from the second ID block 4, and sends the substrate W subjected to the coating treatment to the IF block 6. Here, the coating block 3 forms an antireflection film and a resist film on the substrate W successively.

Thereafter, the IF block 6 unloads the substrate W subjected to the coating treatment into the exposure device EXP. Thereafter, the IF block 6 loads the exposed substrate W from the exposure device EXP, and sends the exposed substrate W to the coating block 3. The coating block 3 sends the substrate W subjected to the exposure treatment to the second ID block 4 without performing any coating treatment on the substrate W sent from the IF block 6.

The second ID block 4 sends the substrate W subjected to the exposure treatment to the developing block 5. Thereafter, the developing block 5 performs the developing treatment on the substrate W sent from the second ID block 4 and subjected to the exposure treatment, and sends the substrate W subjected to the developing treatment to the first ID block 2. The first ID block 2 returns the substrate W subjected to the developing treatment to a carrier C placed on the platform 13 placed on any of the two openers 9, 10 (see FIG. 6).

According to this embodiment, the platform 13 is placed on the first ID block 2, and the platform 47 is placed on the second ID block 4. A currently-used carrier platform is provided only on the first ID block 2. Accordingly, the substrate W is transported in both the forward path and the return path between the first ID block 2 and the IF block 6. According to this embodiment, the substrate W is transported in the forward path from the second ID block 4, disposed between the developing block 5 and the coating block 3, to the IF block 6 without being transported from the first IF block 2 to the second ID block 6. Consequently, the transportation process in the forward path by the developing block 5 disposed between the first ID block 2 and the second ID block 4 is reduced. As a result, an entire throughput of a substrate treating apparatus 1 can be enhanced.

THIRD EMBODIMENT

A third embodiment of the present invention will now be described with reference to the drawings. Here, the description common to that of the first and second embodiments is to be omitted.

For instance, in FIG. 3 of the first embodiment, the coating block 3 and the developing block 5 each include two (i.e., a plurality of) treatment layers, and the number of coating-treatment layers in the coating block 3 is equal to the number of developing-treatment layers in the developing block 5. In this regard, the number of coating-treatment layers may be larger than that of developing-treatment layers.

Figure 11:
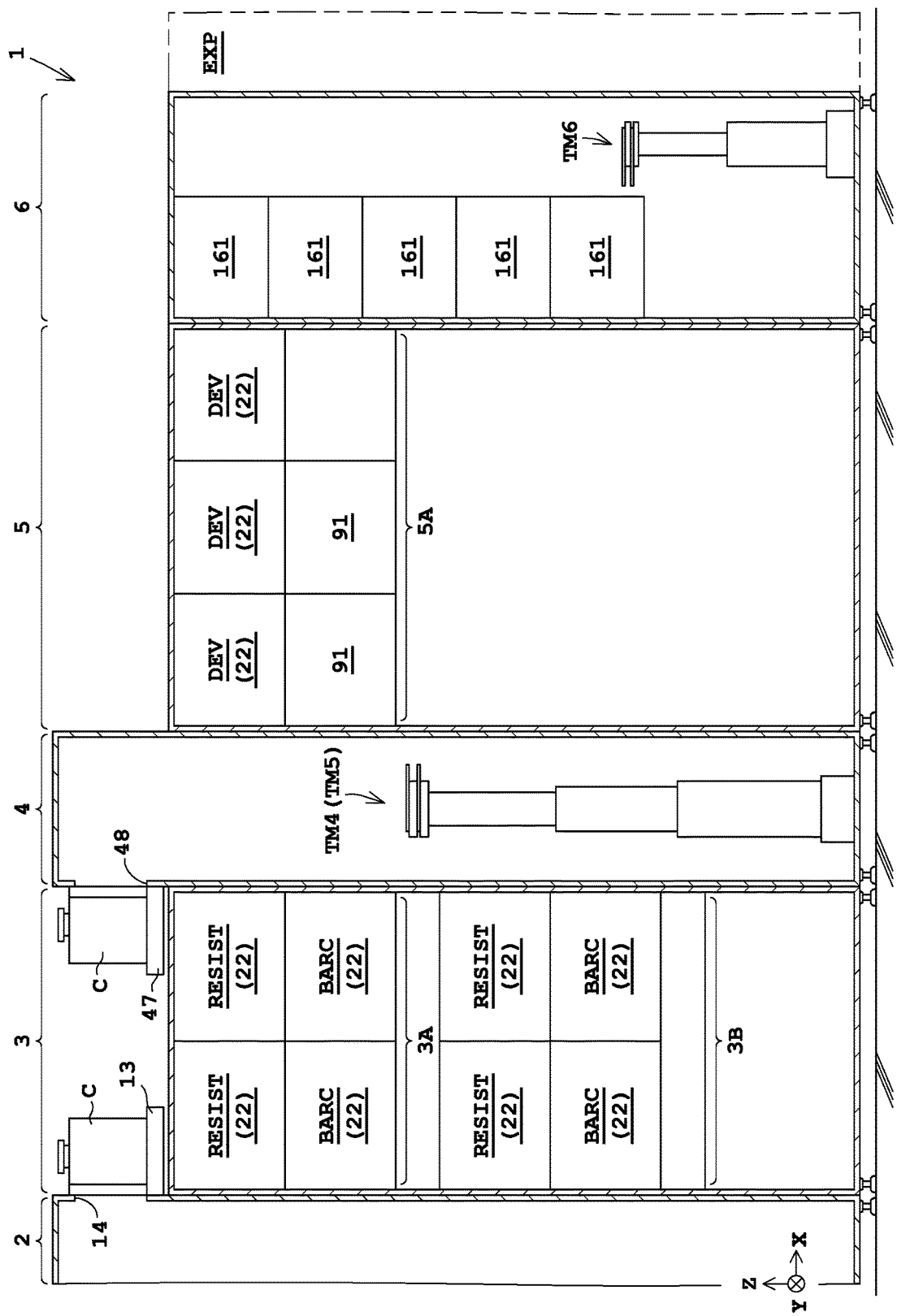
FIG. 11 is a right side view of a substrate treating apparatus according to a third embodiment.

FIG. 11 is a right side view illustrating arrangement of a liquid treating units 22 in a coating block 3 and a developing block 5 of the substrate treating apparatus according to the third embodiment. The first ID block 2, the coating block 3, the second ID block 4, the developing block 5, and the IF block 6 are arranged in this order as in FIG. 11. The coating block 3 includes two coating-treatment layers 3A, 3B arranged in the upward/downward direction. The developing block 5 includes a single developing-treatment layer 5A. That is, the number of coating-treatment layers in the coating block 3 (i.e., two) is larger than that of developing-treatment layer in the developing block 5 (i.e., one). It should be noted that the coating block 3 may include three coating-treatment layers arranged in the upward/downward direction, and that the developing block 5 may include two developing-treatment layers arranged in the upward/downward direction.

<Operation of Substrate Treating Apparatus 1>

Figure 12:
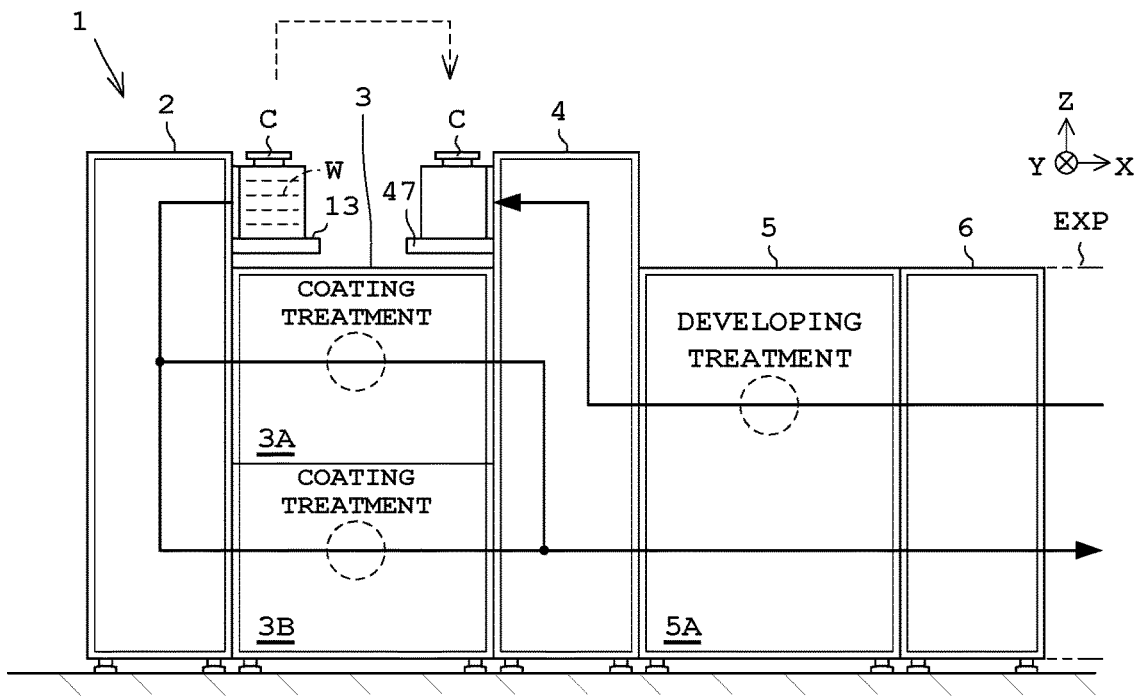
FIG. 12 illustrates operation of the substrate treating apparatus according to the third embodiment.

An operation of the substrate treating apparatus 1 according to this embodiment will now be described. Reference is made to FIG. 11 or 12. The first ID block 2 takes a substrate W from the carrier C placed on the carrier platform 13 of one of the two openers 9, 10 (see FIG. 6), and transports the taken substrate W to one of the two coating-treatment layers 3A, 3B in the coating block 3. Here, the two coating-treatment layers 3A, 3B are configured to be capable of performing a coating treatment in parallel.

The two coating treatment layers 3A, 3B each perform the coating treatment on the substrate W sent from the first ID block 2, and transports the substrate W subjected to the coating treatment to the second ID block 4. The second ID block 4 transports the substrate W, sent from one of the two coating treatment layers 3A, 3B, to the single developing-treatment layer 5A in the developing block 5. The developing-treatment layer 5A sends the substrate W, sent from the second ID block 4, to the IF block 6 without performing any developing treatment on the substrate W.

The IF block 6 unloads the substrate W sent from the developing-treatment layer 5A into the exposure device EXP. The external exposure device EXP performs an exposure treatment on the substrate W unloaded from the IF block 6. The IF block 6 loads the substrate W subjected to the exposure treatment from the exposure device EXP, and sends the substrate W subjected to the exposure treatment to the single developing-treatment layer 5A in the developing block 5.

The developing-treatment layer 5A performs the developing treatment on the substrate W subjected to the exposure treatment, and sends the substrate W subjected to the developing treatment to the second ID block 4. The second ID block 4 returns the substrate W subjected to the developing treatment to a carrier C placed on the platform 47 on any of the two openers 45, 46 (see FIG. 6).

According to this embodiment, when a substrate transportation process by the coating-treatment layers is larger in number than that by the developing-treatment layers, the same number of the coating-treatment layers and the developing-treatment layers may elongate a standby time of the developing-treatment layers. Accordingly, it is possible to increase the substrate treating ability of the coating-treatment layers (coating block 3) entirely and to increase a transportation speed at which the substrate W is sent from the coating-treatment layer to the second ID block 4 by increasing the number of the coating-treatment layers to be larger than that of the developing-treatment layers. Moreover, the second ID block 4 is disposed between the coating block 3 and the developing block 5. Accordingly, it is possible to send the substrate to the treatment layers individually even if the number of the coating-treatment layers differs from that of the developing-treatment layers.

Moreover, in the actual substrate treating apparatus 1, the number of the substrate transporting process by the coating-treatment layer is larger than that by the developing-treatment layer. For instance, from the description of the steps S02, S06 in the above first embodiment, the third substrate transport mechanism TM3 in the coating block 3 transports the substrate W, received from the feeding substrate buffer SBF3, to the adhesion enhancing treatment unit PAHP, the cooling unit CP, the coating unit BARC, the heating/cooling unit PHP, the cooling unit CP, the coating unit RESIST, the heating/cooling unit PHP, and the substrate platform PS1 (eight portions in total) in this order. On the other hand, the substrate transport mechanism TM3 in the developing block 5 transports the substrate W, received from the heating/cooling unit PHP, to the cooling unit CP, the developing unit DEV, the heating/cooling unit PHP, and the return substrate buffer RBF3 (four portions in total) in this order. Accordingly, it is possible to increase the substrate treating ability of the coating-treatment layers (coating block 3) entirely and to increase a transportation speed at which the substrate is sent from the coating-treatment layer to the second ID block 4 by increasing the number of the coating-treatment layers to be larger than that of the developing-treatment layers.

FOURTH EMBODIMENT

A fourth embodiment of the present invention will now be described with reference to the drawings. Here, the description common to that of the first to third embodiments is to be omitted.

In the third embodiment, the substrate treating apparatus 1 takes a substrate W from the carrier C placed on the platform 13 of the first ID block 2 illustrated on the left side of FIG. 12, and accommodates the substrate W into the carrier C placed on the platform 47 of the second ID block 4 illustrated on the right side of FIG. 12. In this regard, such tasks are replaceable with each other. That is, the substrate treating apparatus 1 may take a substrate W from the carrier C placed on the platform 47 of the second ID block 4 illustrated on the right side of FIG. 12, and may accommodate the substrate W into the carrier C placed on the platform 13 of the first ID block 2 illustrated on the left side of FIG. 12.

Figure 13:
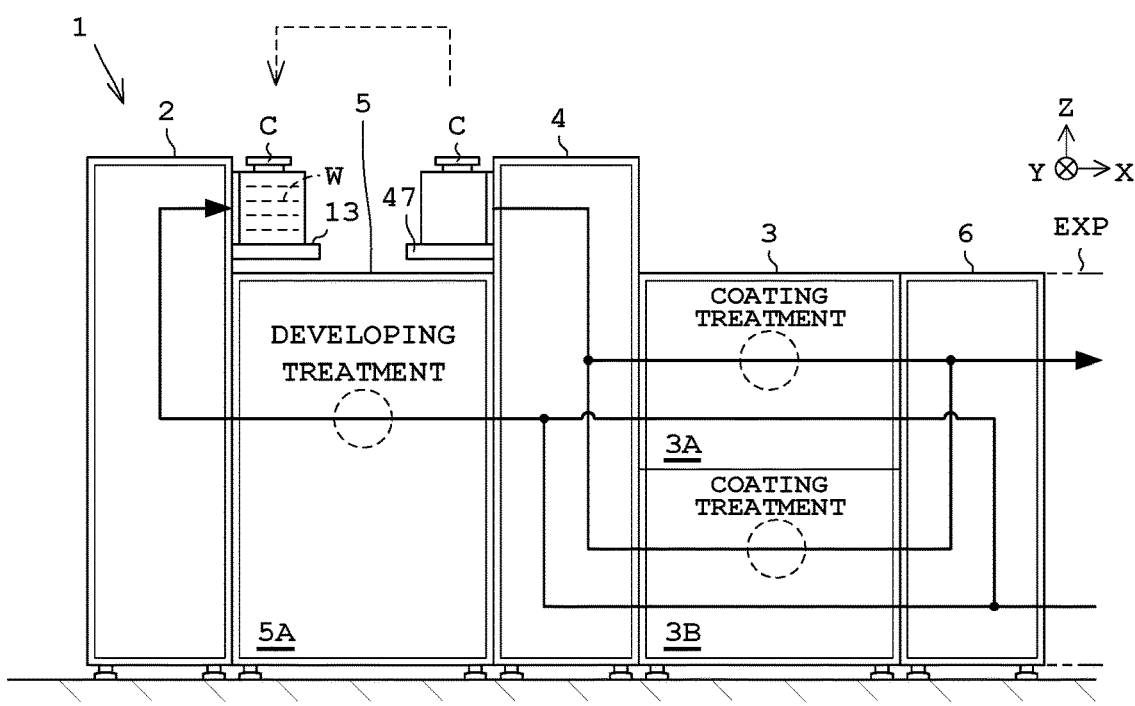
FIG. 13 illustrates a configuration and operation of a substrate treating apparatus according to a fourth embodiment.

FIG. 13 illustrates the configuration and operation of the substrate treating apparatus 1. The first ID block 2, the developing block 5 (first treating block), the second ID block 4, the coating block 3 (second treating block), and the IF block 6 are arranged in this order as in FIG. 13. The developing block 5 includes a single developing-treatment layer 5A. The coating block 3 includes two coating-treatment layers 3A, 3B arranged in the upward/downward direction. That is, the number of coating-treatment layers in the coating block 3 (second treating block) (i.e., two) is larger than that of developing-treatment layer in the developing block 5 (first treating block) (i.e., one).

The second ID block 4 takes a substrate W from a carrier C placed on the platform 47 of one of the two openers 45, 46, and sends the taken substrate W to one of the two coating-treatment layers 3A, 3B in the coating block 3. The two coating-treatment layers 3A, 3B each perform the coating treatment on the substrate W sent from the second ID block 4, and sends the substrate W subjected to the coating treatment to the IF block 6. Here, the two coating-treatment layers 3A, 3B are configured to be capable of performing a coating treatment in parallel.

The IF block 6 unloads the substrate W subjected to the coating treatment into the exposure device EXP. The external exposure device EXP performs an exposure treatment on the substrate W unloaded from the IF block 6. The IF block 6 loads the substrate W subjected to the exposure treatment from the exposure device EXP, and sends the substrate W, subjected to the exposure treatment, to one of the two coating-treatment layers 3A, 3B.

In each of the two coating-treatment layers 3A, 3B, the substrate W subjected to the exposure treatment is sent to the second ID block 4. The second ID block 4 sends the substrate W subjected to the exposure treatment to the single developing-treatment layer 5A in the developing block 5.

The developing-treatment layer 5A performs the developing treatment on the substrate W sent from the second ID block 4 and subjected to the exposure treatment, and sends the substrate W subjected to the developing treatment to the first ID block 2. The first ID block 2 returns the substrate W subjected to the developing treatment to a carrier C placed on the platform 13 of one of the two openers 9, 10.

According to this embodiment, when a substrate transportation process by the coating-treatment layers is larger in number than that by the developing-treatment layers, the same number of the coating-treatment layers and the developing-treatment layers may elongate a standby time of the developing-treatment layers. Accordingly, it is possible to increase the substrate treating ability of the coating-treatment layers (coating block 3) entirely by increasing the number of the coating-treatment layers to be larger than that of the developing-treatment layers. Moreover, the second ID block 4 is disposed between the coating block 3 and the developing block 5. Accordingly, it is possible to send the substrate W to the treatment layers individually even if the number of the coating-treatment layers differs from that of the developing-treatment layers.

Moreover, in the actual substrate treating apparatus 1, the number of the substrate transporting process by the coating-treatment layer is larger than that by the developing-treatment layer. As a result, the substrate treating ability in the entire coating-treatment layer (coating block 3) can be enhanced.

This invention is not limited to the foregoing examples, but may be modified as follows.

Figure 14:
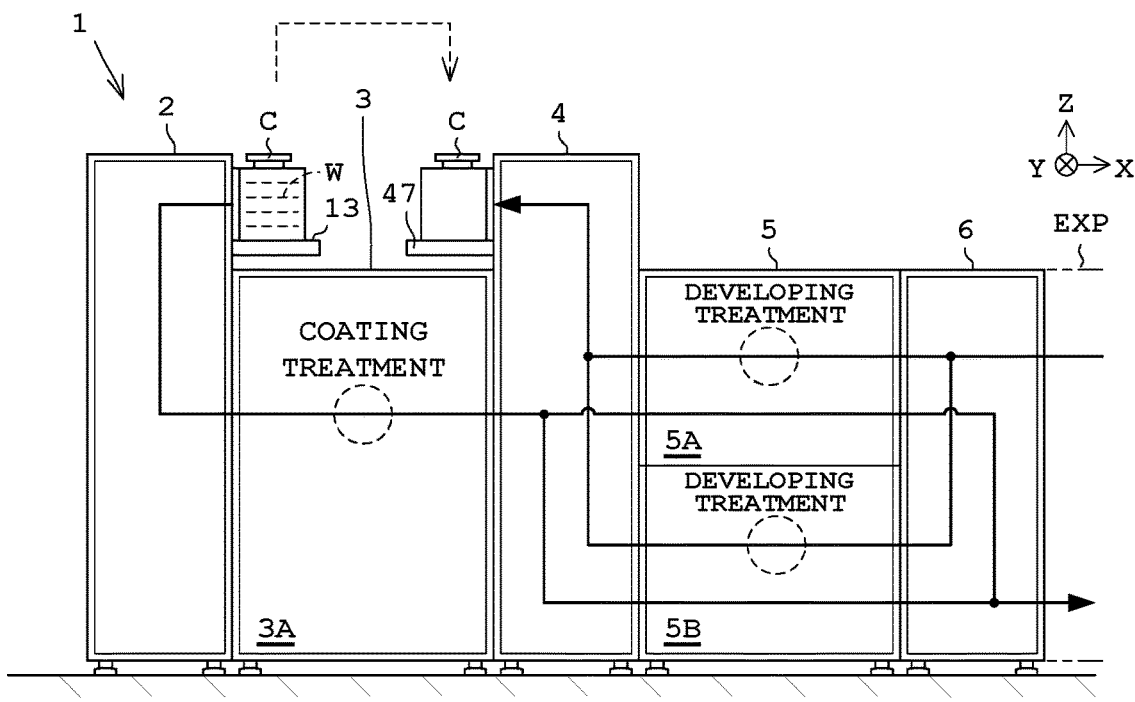
FIG. 14 illustrates a configuration and operation of a substrate treating apparatus according to one modification of the present invention.

(1) As illustrated in FIG. 12, in the third embodiment described above, the number of coating-treatment layers in the coating block 3 (first treating block) (i.e., two) is larger than that of developing-treatment layer in the developing block 5 (second treating block) (i.e., one). In this regard, as illustrated in FIG. 14, the number of coating-treatment layer (i.e., one) may be smaller than that of developing-treatment layers (i.e., two).

In such a case, prior to the exposure treatment, the second ID block 4 sends the substrate W, sent from the single coating-treatment layer 3A and subjected to the coating treatment, to one of the two developing-treatment layers 5A, 5B in the developing block 5. In each of the two developing-treatment layers 5A, 5B, the substrate W, sent from the second ID block 4, is sent to the IF block 6. In addition, subsequent to the exposure treatment, the two developing-treatment layers 5A, 5B each perform the developing treatment on the substrate W sent from the IF block 6 and subjected to the exposure treatment, and sends the substrate W subjected to the developing treatment to the second ID block 4. The second ID block 4 returns the developed substrate W to a carrier C on the platform 47.

(2) As illustrated in FIG. 13, in the fourth embodiment described above, the number of coating-treatment layers in the coating block 3 (second treating block) (i.e., two) is larger than that of developing-treatment layer in the developing block 5 (first treating block) (i.e., one). In this regard, as illustrated in FIG. 15, the number of coating-treatment layer (i.e., one) may be smaller than that of developing-treatment layers (i.e., two).

Figure 15:
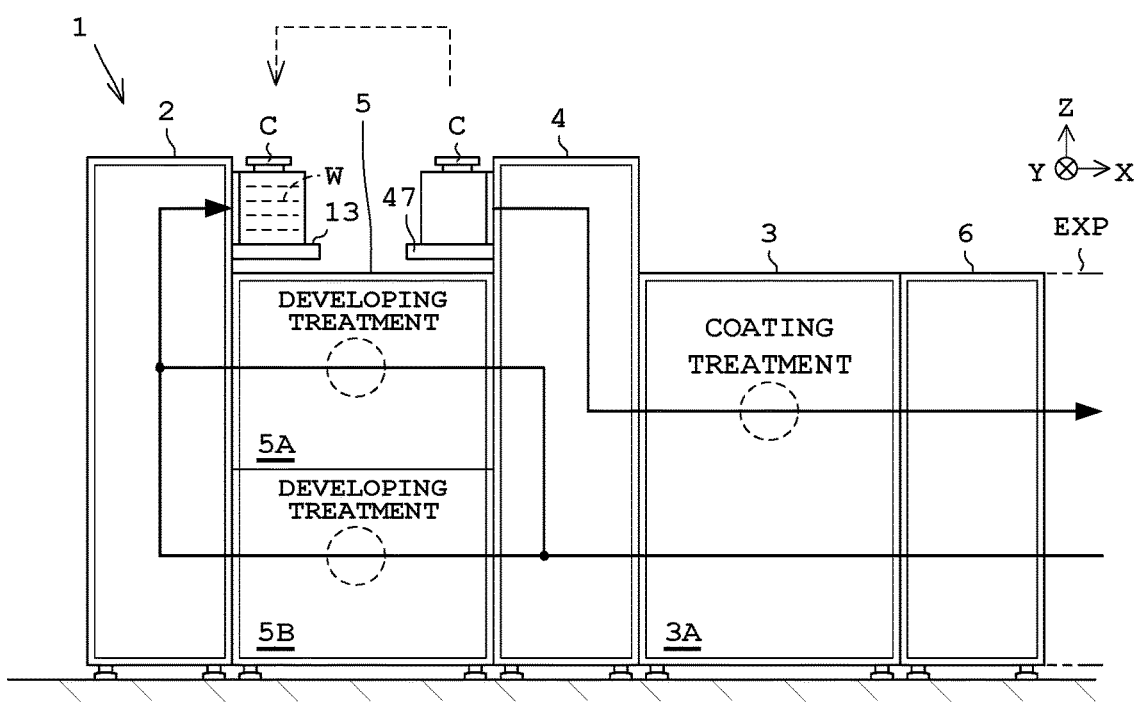
FIG. 15 illustrates a configuration and operation of a substrate treating apparatus according to another modification of the present invention.

In such a case, subsequent to the exposure treatment, the second ID block 4 sends the substrate W, sent from the coating block 3 and subjected to the exposure treatment, to one of the two developing-treatment layers 5A, 5B in the developing block 5 (see FIG. 15). The two developing-treatment layers 5A, 5B each perform the developing treatment on the substrate W subjected to the exposure treatment, and sends the substrate W subjected to the developing treatment to the first ID block 2. The first ID block 2 returns the substrate W subjected to the developing treatment to a carrier C on the platform 13.

Figure 16:
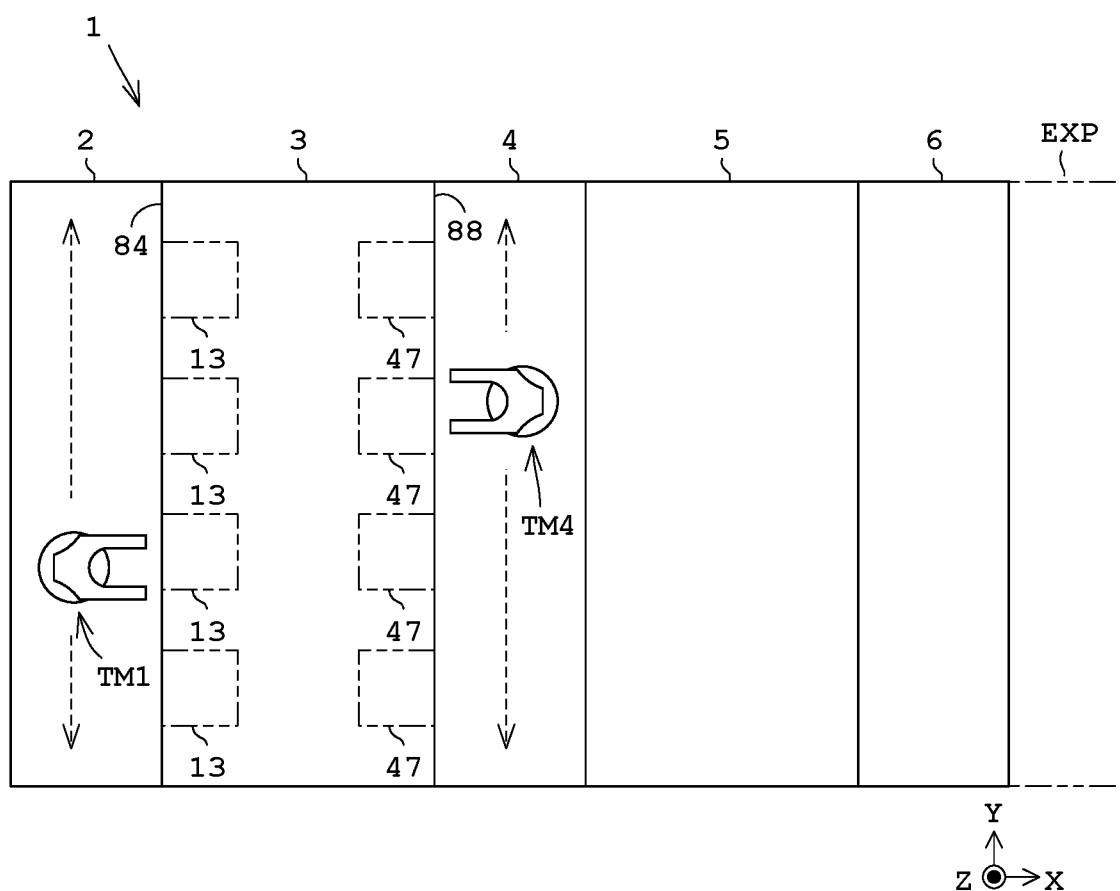
FIG. 16 illustrates a substrate transport mechanism and a platform of the substrate treating apparatus according to the modification of the present invention.

(3) In the above embodiments and modifications, the first ID block 2 includes the two substrate transport mechanisms TM1, TM2. Alternatively, the first ID block 2 may include the single substrate transport mechanism TM1 as in FIG. 16. In this case, a plurality of (e.g., four) platforms 13 may be arranged on a wall 84 of the first ID block 2 in line in the Y-direction. The substrate transport mechanism TM1 may be configured in such a manner as to be movable in the Y-direction by an electric motor in order to take and accommodate substrates W from and into the carriers C placed the platforms 13.

Moreover, the first ID block 2 may include not the substrate transport mechanism TM2 but only the substrate transport mechanism TM1. As in the first embodiment, the single substrate transport mechanism TM1 may be fixed on a floor of the first ID block 2 so as not to move horizontally (especially, Y-direction). Moreover, the first ID block 2 may include three or more substrate transport mechanisms.

(4) In the above embodiments and modifications, the second ID block 4 includes the two substrate transport mechanisms TM4, TM5. Alternatively, the second ID block 4 may include the single substrate transport mechanism TM4 as in FIG. 16. Also, in this case, a plurality of (e.g., four) platforms 47 may be arranged on a wall 88 of the second ID block 4 in line in the Y-direction. The substrate transport mechanism TM4 may be configured in such a manner as to be movable in the Y-direction by an electric motor in order to take and accommodate substrates W from and into the carriers C placed the platforms 47.

Moreover, as in the first embodiment, the single substrate transport mechanism TM4 may be fixed on a floor of the second ID block 4 so as not to move horizontally (especially, Y-direction). Moreover, the second ID block 4 may include three or more substrate transport mechanisms.

(5) In the embodiments and the modifications described above, the fourth substrate transport mechanism TM4 of the second ID block 4 is capable of transporting a substrate W among the four substrate platforms PS1 to PS4, the two return substrate buffers RBF3, RBF4, and the carrier C placed on the opener 45, as illustrated in FIG. 1. Moreover, the fifth substrate transport mechanism TM5 is capable of transporting a substrate W among the four substrate platforms PS1 to PS4, the two return substrate buffers RBF3, RBF4, and the carrier C placed on the opener 46.

For instance, the fourth substrate transport mechanism TM4 may transport a substrate W among the four substrate platforms PS1 to PS4 (i.e., between the coating block 3 and the developing block 5), and the fifth substrate transport mechanism TM5 may transport a substrate W between the two return substrate buffers RBF3, RBF4 and the opener 46. Such task is replaceable between the fourth substrate transport mechanism TM4 and the fifth substrate transport mechanism TM5.

(6) In the above embodiments and modifications, the resist film is formed on the substrate W to which the nozzles supply the resist liquid, and thereafter, the substrate W is transported to the exposure device EXP while keeping its condition. In this regard, a resist cover film may be formed on the resist film on the substrate W. As in FIG. 3, each of the two developing-treatment layers 5A, 5B in the developing block 5 may each include two coating units 91.

The coating unit 91 includes a holding rotation portion 31 that holds and rotates the substrate W, and coating nozzles 32 that dispense a treating liquid for the resist cover film. The coating unit 91 of the developing block 5 causes the nozzles 32 to dispense the treating liquid to the substrate W to which a resist coating treatment has been performed, thereby forming the resist cover film on the resist film of the substrate W. The developing block 5 may send the substrate W, on which the resist cover film is formed, to the IF block 6. After the exposure treatment, the resist cover film is removed by the developing unit DEV.

(7) In the above embodiments and modifications, the substrate treating apparatus 1 includes the two treating blocks (coating block 3 and developing block 5). In this regard, the substrate treating apparatus 1 may include three or more treating blocks.

Figure 17:
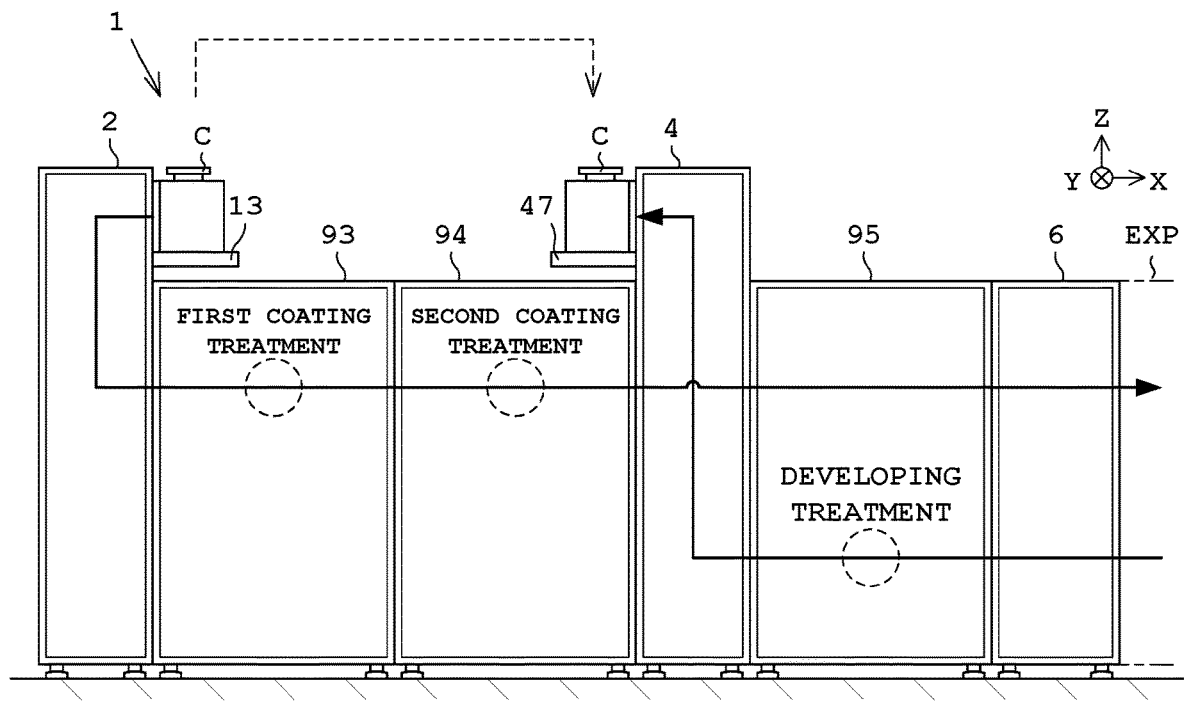
FIG. 17 illustrates a configuration and operation of a substrate treating apparatus according to still another modification of the present invention.

First, the following describes a substrate treating apparatus 1 in FIG. 17. As illustrated in FIG. 17, the substrate treating apparatus 1 includes three (a plurality of) treating blocks 93 to 95 that perform different predetermined treatments, for example. The three treating blocks 93 to 95 are arranged in line. Here, the three treating blocks 93 to 95 correspond to a first coating block 93, a second coating block 94, and a developing block 95, respectively. It is supposed that the three treating blocks 93 to 95 each include a single treatment layer. It should be noted that the treating blocks 93, 94 on the left side of the second ID block 4 (adjacent to the first ID block 2) in FIG. 17 may be referred to as at least one treating block on a first end side. It should be noted that the treating block 95 on the right side of the second ID block 4 (adjacent to the IF block 6) may be referred to as at least one treating block on a second end side.

The first coating block 93 performs a first coating treatment to form an antireflection film on the substrate W. The first coating block 93 includes an adhesion enhancing treatment unit PAHP, a cooling unit CP, a coating unit BARC, and a third substrate transport mechanism TM3, for example.

The second coating block 94 performs a second coating treatment to form a resist film on the substrate W. The second coating block 94 includes a heating/cooling unit PHP, a cooling unit CP, a coating unit RESIST, and a third substrate transport mechanism TM3, for example. The developing block 95 performs a developing treatment. The developing block 95 includes a cooling unit CP, a developing unit DEV, a heating/cooling unit PHP, and a third substrate transport mechanism TM3, for example.

The first ID block 2 is connected to the first coating block 93 on the first end of the three treating blocks 93 to 95. The IF block 6 is connected to the developing block 95 on the second end of the three treating blocks 93 to 95. The second ID block 4 is disposed between the second coating block 94 and the developing block 95 among the three treating blocks 93 to 95.

An operation of the substrate treating apparatus 1 according to this modification will now be described. The first ID block 2 takes a substrate W from a carrier C placed on the platform 13 of either of the two openers 9, 10 (see FIG. 6), and sends the taken substrate W to the first coating block 93. The three treating blocks 93 to 95 and the second ID block 4 send the substrate W, sent from the first ID block 2, from the first coating block 93 to the IF block 6 via the second ID block 4. That is, the substrate W is transported to the first coating block 93, the second coating block 94, the second ID block 4, and the developing block 95 in this order.

When the substrate W is sent from the first coating block 93 to the IF block 6, the treating blocks 93, 94 disposed between the first ID block 2 and the second ID block 4 each perform a predetermined treatment on the substrate W to be sent. That is, the first coating block 93 performs a first coating treatment to form an antireflection film on the substrate W. The second coating block 94 performs a second coating treatment to form a resist film on the substrate W.

The IF block 6 unloads the sent substrate W into the exposure device EXP. The IF block 6 loads the substrate W subjected to the exposure treatment in the exposure device EXP from the exposure device EXP, and sends the loaded substrate W to the developing block 95.

The developing block 95 of the three treating blocks 93 to 95 that is disposed between the second ID block 4 and the IF block 6 sends the substrate W, sent from the IF block 6, from the developing block 95 to the second ID block 4. Moreover, when sending the substrate W from the developing block 95 to the second ID block 4, the developing block 95 performs the developing treatment on the substrate W to be sent. The second ID block 4 returns the sent substrate W to a carrier C placed on the platform 47 of one of the two openers 45, 46 (see FIG. 6).

According to this modification, the platform 13 is placed on the first ID block 2, and the platform 47 is placed on the second ID block 4. A currently-used carrier platform is provided only on the first ID block 2. Accordingly, the substrate W is transported in both the forward path and the return path between the first ID block 2 and the IF block 6. According to this modification, the substrate W is sent in the return path from the IF block 6 to the second ID block 4 disposed between the two treating blocks 94, 95 without being transported from the IF block 6 to the first ID block 2. Consequently, the transportation process in the return path by the treating blocks 93, 94 disposed between the first ID block 2 and the second ID block 4 is reduced. As a result, an entire throughput of a substrate treating apparatus 1 can be enhanced.

Figure 18:
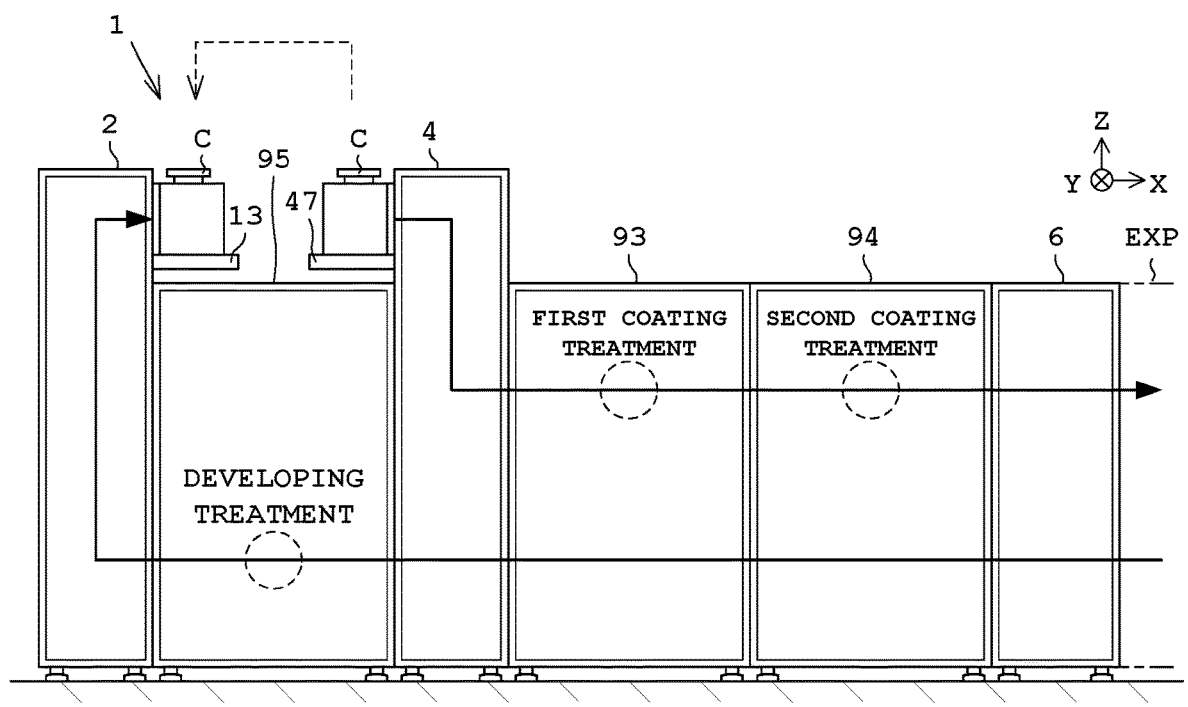
FIG. 18 illustrates a configuration and operation of a substrate treating apparatus according to still another modification of the present invention.

(8) The following describes a substrate treating apparatus 1 in FIG. 18. In the substrate treating apparatus 1 in FIG. 18, the first ID block 2, the developing block 95, the second ID block 4, the first coating block 93, the second coating block 94, and the IF block 6 are arranged in this order.

An operation of the substrate treating apparatus 1 according to this modification will now be described. It is supposed that three treating blocks 93 to 95 each include a single treatment layer.

The second ID block 4 takes a substrate W from a carrier C placed on the platform 47 of one of the two openers 45, 46 (see FIG. 6), and sends the taken substrate W to the first coating block 93 of the second ID block 4 adjacent to the IF block 6.

The treating blocks 93, 94 of the three treating blocks 93 to 95 that are disposed between the second ID block 4 and the IF block 6 send the substrate W, sent from the second ID block 4, from the first coating block 93 to the IF block 6. When the substrate W is sent from the first coating block 93 to the IF block 6, the treating blocks 93, 94 disposed between the second ID block 4 and the IF block 6 each perform a predetermined treatment on the substrate W to be sent.

The IF block 6 unloads the sent substrate W into the exposure device EXP. The IF block 6 loads the substrate W subjected to the exposure treatment in the exposure device EXP from the exposure device EXP, and sends the loaded substrate W to the second coating block 94.

The three treating blocks 93 to 95 and the IF block 6 send the substrate W, sent from the IF block 6, from the second coating block 94 to the first ID block 2 via the second ID block 4. When the substrate W is sent from the second coating block 94 to the first ID block 2, the developing block 95 disposed between the first ID block 2 and the second ID block 4 performs a developing treatment on the substrate W to be sent. The first ID block 2 returns the sent substrate W to a carrier C placed on the platform 13 of one of the two openers 9, 10 (see FIG. 6).

According to this modification, the platform 13 is placed on the first ID block 2, and the platform 47 is placed on the second ID block 4. A currently-used carrier platform is provided only on the first ID block 2. Accordingly, the substrate W is transported in both the forward path and the return path between the first ID block 2 and the IF block 6. According to this modification, the substrate W is sent in the forward path from the second ID block 4, disposed between the two treating blocks 95, 93, to the IF block 6 without being transported from the first ID block 2 to the IF block 6. Consequently, the transportation process in the forward path by the developing block 95 disposed between the first ID block 2 and the second ID block 4 is reduced. As a result, an entire throughput of a substrate treating apparatus 1 can be enhanced.

The present invention may be embodied in other specific forms without departing from the spirit or essential attributes thereof and, accordingly, reference should be made to the appended claims, rather than to the foregoing specification, as indicating the scope of the invention. The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:
    a plurality of treating blocks arranged in line;
    a first indexer block connected to a treating block of the treating blocks on a first end and on which a first carrier platform for placing a carrier capable of accommodating substrates thereon is disposed;
    an interface block connected to a treating block of the treating blocks on a second end and configured to load and unload a substrate into and from an external device configured to perform a predetermined treatment; and
    a second indexer block disposed between two treating blocks of the treating blocks and on which a second carrier platform for placing a carrier thereon is disposed; wherein
    the first indexer block takes a substrate from the carrier placed on the first carrier platform and sends the taken substrate to the treating block on the first end,
    the treating blocks and the second indexer block send the substrate, having been sent from the first indexer block, from the treating block on the first end to the interface block via the second indexer block,
    a treating block disposed between the first indexer block and the second indexer block performs a predetermined treatment on the substrate to be sent when the substrate is sent from the treating block on the first end to the interface block,
    the interface block unloads the sent substrate into the external device,
    the interface block loads the substrate, subjected to the predetermined treatment by the external device, from the external device and sends the loaded substrate to the treating block on the second end,
    a treating block of the treating blocks disposed between the second indexer block and the interface block sends the substrate, having been sent from the interface block, from the treating block on the second end to the second indexer block,
    the treating block disposed between the second indexer block and the interface block performs a predetermined treatment on the substrate to be sent when the substrate is sent from the treating block on the second end to the second indexer block, and
    the second indexer block returns the sent substrate to the carrier placed on the second carrier platform.

2. The substrate treating apparatus according to claim 1, wherein
    the treating blocks includes a first treating block configured to perform a first treatment, and a second treating block configured to perform a second treatment,
    the first indexer block is connected to the first treating block, the first treating block is connected to the second indexer block, the second indexer block is connected to the second treating block, the second treating block is connected to the interface block, the interface block loads and unloads the substrate into and from an external device configured to perform a third treatment, the first indexer block takes the substrate from the carrier placed on the first carrier platform and sends the taken substrate to the first treating block, the first treating block performs the first treatment on the substrate, having been sent from the first indexer block, and sends the substrate subjected to the first treatment to the second indexer block, the second indexer block sends the substrate, having been sent from the first treating block, to the second treating block, the second treating block sends the substrate, having been sent from the second indexer block, to the interface block, the interface block unloads the substrate, having been sent from the second treating block, into the external device, the interface block loads the substrate, subjected to the third treatment, from the external device and sends the loaded substrate to the second treating block, the second treating block performs the second treatment on the substrate subjected to the third treatment, and sends the substrate subjected to the second treatment to the second indexer block, and the second indexer block returns the substrate subjected to the second treatment to the carrier placed on the second carrier platform.

3. The substrate treating apparatus according to claim 1, wherein a carrier transport mechanism configured to transport the carrier between the first carrier platform and the second carrier platform.

4. The substrate treating apparatus according to claim 3, wherein the carrier transport mechanism is mounted on the first treating block.

5. A substrate treating apparatus for treating a substrate, comprising:

a plurality of treating blocks arranged in line;

a first indexer block connected to a treating block of the treating blocks on a first end and on which a first carrier platform for placing a carrier capable of accommodating substrates thereon is disposed;

an interface block connected to a treating block of the treating blocks on a second end and configured to load and unload a substrate into and from an external device configured to perform a predetermined treatment; and a second indexer block disposed between two treating blocks of the treating blocks and on which a second carrier platform for placing a carrier thereon is disposed; wherein the second indexer block takes a substrate from the carrier placed on the second carrier platform and sends the taken substrate to an adjacent treating block adjacent to the second indexer block toward the interface block, a treating block of the treating blocks disposed between the second indexer block and the interface block sends the substrate, having been sent from the second indexer block, from the adjacent treating block to the interface block, the treating block disposed between the second indexer block and the interface block performs a predetermined treatment on the substrate to be sent when the substrate is sent from the adjacent treating block to the interface block;

the interface block unloads the sent substrate into the external device, the interface block loads the substrate, subjected to the predetermined treatment by the external device, from the external device and sends the loaded substrate to the treating block on the second end, the treating blocks and the second indexer block send the substrate, having been sent from the interface block, from the treating block on the second end to the first indexer block via the second indexer block, a treating block disposed between the first indexer block and the second indexer block performs a predetermined treatment on the substrate to be sent when the substrate is sent from the treating block on the second end to the first indexer block; and the first indexer block returns the sent substrate to a carrier placed on the first carrier platform.

6. The substrate treating apparatus according to claim 5, wherein the treating blocks includes a first treating block configured to perform a first treatment, and a second treating block configured to perform a second treatment, the first indexer block is connected to the first treating block, the first treating block is connected to the second indexer block, the second indexer block is connected to the second treating block, the second treating block is connected to the interface block, the interface block loads and unloads the substrate into and from an external device configured to perform a third treatment, the second indexer block takes a substrate from the carrier placed on the second carrier platform and sends the taken substrate to the second treating block, the second treating block performs the second treatment on the substrate sent from the second indexer block, and sends the substrate subjected to the second treatment to the interface block, the interface block unloads the substrate subjected to the second treatment into the external device, the interface block loads the substrate, subjected to the third treatment, from the external device and sends the substrate, subjected to the third treatment, to the second treating block, the second treating block sends the substrate subjected to the third treatment to the second indexer block, the second indexer block sends the substrate subjected to the third treatment to the first treating block, the first treating block performs the first treatment on the substrate, having been sent from the second indexer block and subjected to the third treatment, and sends the substrate subjected to the first treatment to the first indexer block, and the first indexer block returns the substrate subjected to the first treatment to the carrier placed on the first carrier platform.

7. The substrate treating apparatus according to claim 6, wherein the first treating block includes a plurality of first treatment layers arranged in an upward/downward direction, the second treating block includes a single second treatment layers or a plurality of second treatment layers arranged in an upward/downward direction, and the number of the first treatment layers is larger than that of the second treatment layers.

8. The substrate treating apparatus according to claim 7, wherein the first treating block is a coating block configured to perform a coating treatment, the second treating block is a developing block configured to perform a developing treatment, and the external device is an exposure device configured to perform an exposure treatment.

9. The substrate treating apparatus according to claim 6, wherein the first treating block includes a single first treatment layers or a plurality of first treatment layers arranged in an upward/downward direction, the second treating block includes a plurality of second treatment layers arranged in the upward/downward direction, and the number of the second treatment layers is larger than that of the first treatment layers.

10. A substrate transporting method for a substrate treating apparatus including:

a plurality of treating blocks arranged in line;

a first indexer block connected to a treating block of the treating blocks on a first end and on which a first carrier platform for placing a carrier capable of accommodating substrates thereon is disposed; and an interface block connected to a treating block of the treating blocks on a second end and configured to load and unload a substrate into and from an external device configured to perform a predetermined treatment; the method comprising:

a taking and sending step of causing the first indexer block to take a substrate from the carrier placed on the first carrier platform and to send the taken substrate to the treating block on the first end;

a first sending step of causing the treating blocks and a second indexer block disposed between two of the treating blocks to send the substrate, sent from the first indexer block, from the treating block on the first end to the interface block via the second indexer block;

a first treating step of causing a treating block disposed between the first indexer block and the second indexer block to perform a predetermined treatment on the substrate to be sent when the substrate is sent from the treating block on the first end to the interface block;

an unloading step of causing the interface block to unload the sent substrate into the external device;

a loading and sending step of causing the interface block to load the substrate, subjected to the predetermined treatment by the external device, from the external device and to send the loaded substrate to the treating block on the second end;

a second sending step of causing a treating block of the treating blocks, disposed between the second indexer block and the interface block, to send the substrate, having been sent from the interface block, from the treating block on the second end to the second indexer block;

a second treating step of causing the treating block disposed between the second indexer block and the interface block to perform a predetermined treatment on the substrate to be sent when the substrate is sent from the treating block on the second end to the second indexer block; and a returning step of causing the second indexer block to return the sent substrate to the carrier placed on the second carrier platform provided in the second indexer block.

11. A substrate transporting method for a substrate treating apparatus including:

a plurality of treating blocks arranged in line;

a first indexer block connected to a treating block on the first end of the treating blocks and on which a first carrier platform for placing a carrier capable of accommodating substrates thereon is disposed; and an interface block connected to a treating block on a second end of the treating blocks and configured to load and unload a substrate into and from an external device configured to perform a predetermined treatment; the method comprising:

a taking and sending step of causing the second indexer block, disposed between two treating blocks of the treating blocks, to take a substrate from the carrier placed on the second carrier platform in the second indexer block and to send the taken substrate to an adjacent treating block adjacent to the second indexer block toward to the interface block, a first sending step of causing a treating block of the treating blocks, disposed between the second indexer block and the interface block, to send the substrate, having been sent from the second indexer block, from the adjacent treating block to the interface block;

a first treating step of causing the treating block disposed between the second indexer block and the interface block to perform a predetermined treatment on the substrate to be sent when the substrate is sent from the adjacent treating block to the interface block;

an unloading step of causing the interface block to unload the sent substrate into the external device;

a loading and sending step of causing the interface block to load the substrate, subjected to the predetermined treatment by the external device, from the external device and to send the loaded substrate to the treating block on the second end;

a second sending step of causing the treating blocks and the second indexer block to send the substrate, having been sent from the interface block, from the treating block on the second end to the first indexer block via the second indexer block;

a second treating step of causing a treating block disposed between the first indexer block and the second indexer block to perform a predetermined treatment on the substrate to be sent when the substrate is sent from the treating block on the second end to the first indexer block; and a returning step of causing the first indexer block to return the sent substrate to a carrier placed on the first carrier platform.

* * * * *